(12) United States Patent
Petivan, III et al.

(10) Patent No.: US 9,754,633 B2
(45) Date of Patent: Sep. 5, 2017

(54) MEMORY SHORT PROTECTION SYSTEM

(71) Applicant: Dell Products L.P., Round Rock, TX (US)

(72) Inventors: James L. Petivan, III, Austin, TX (US); Sanjiv C. Sinha, Austin, TX (US); Syed S. Ahmed, Round Rock, TX (US); John Ross Palmer, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/135,211

(22) Filed: Apr. 21, 2016

(65) Prior Publication Data

US 2016/0232949 A1 Aug. 11, 2016

Related U.S. Application Data

(63) Continuation of application No. 14/150,095, filed on Jan. 8, 2014, now Pat. No. 9,350,155.

(51) Int. Cl.
| | |
|---|---|
| *H02H 3/00* | (2006.01) |
| *G11C 5/14* | (2006.01) |
| *H02H 1/00* | (2006.01) |
| *G11C 29/02* | (2006.01) |
| *H02H 7/20* | (2006.01) |

(52) U.S. Cl.
CPC ............. *G11C 5/14* (2013.01); *G11C 29/021* (2013.01); *G11C 29/025* (2013.01); *H02H 1/0038* (2013.01); *H02H 7/20* (2013.01)

(58) Field of Classification Search
CPC .. H02H 1/0038; G11C 29/025; G11C 29/021; G11C 5/14
USPC .......................................................... 361/88
See application file for complete search history.

(56) References Cited

U.S. PATENT DOCUMENTS

| | | | |
|---|---|---|---|
| 4,473,719 A * | 9/1984 | Embree | ............... H04M 19/026 379/382 |
| 6,424,513 B1 | 7/2002 | Wissell et al. | |
| 2006/0294437 A1 | 12/2006 | Washburn et al. | |
| 2012/0120577 A1 | 5/2012 | Chun et al. | |
| 2015/0192629 A1 | 7/2015 | P'etivan, III et al. | |

* cited by examiner

*Primary Examiner* — Thienvu Tran
*Assistant Examiner* — Lucy Thomas
(74) *Attorney, Agent, or Firm* — Haynes and Boone, LLP

(57) ABSTRACT

Memory short detection systems and methods include a power supply system with first power rail. A memory system includes a memory device connector that is configured to couple to a memory device and includes a first pin that is coupled to the first power rail and a second pin located adjacent the first pin. A short detection circuit is coupled to the first pin. The short detection circuit is configured to provide a first voltage from the first power rail, compare the first voltage to a first short detection voltage, and determine whether a short exists across the first pin and the second pin based on the comparing of the first voltage to the first short detection voltage. If a short is determined to exist across the first pin and the second pin, power is prevented from being provided to the memory device connector.

20 Claims, 19 Drawing Sheets

MEMORY SHORT PROTECTION SYSTEM

CROSS-REFERENCE TO RELATED APPLICATIONS

This is a Continuation application to U.S. Utility application Ser. No. 14/150,095 filed Jan. 8, 2014, entitled "Memory Short Protection System," the disclosure of which is incorporated herein by reference in its entirety.

BACKGROUND

The present disclosure relates generally to information handling systems, and more particularly to protecting against shorts in a memory system of an information handling system.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHSs typically include memory systems having memory devices such as, for example, Double Data Rate fourth generation (DDR4) Dual In-line Memory Module (DIMM) memory devices, that connect to memory device connectors (e.g., DDR4 DIMM connectors) in the IHS that are coupled to the processing system and that include instructions and/or other data for providing the functionality of the IHS. Previous generation memory system (e.g., those utilizing DDR3 DIMM memory devices) did not implement pins on the memory device connector that were connected to high voltage rails (e.g., the 12V rail) in the IHS power supply system, and thus the improper seating of the memory devices in the memory device connector had the ability to cause the memory system to work improperly, but was not a threat to cause any failures to the memory device, IHS, or other IHS components. However, DDR4 DIMM memory devices utilize pins on the DDR4 DIMM memory device connector that are connected to high voltage rails (e.g., the 12V rail) in the IHS power supply system. It is possible to have a DDR4 DIMM memory device improperly seated in a DDR4 DIMM memory device connector when, for example, the memory system is built or assembled improperly, when the DDR4 DIMM memory device dislodges from the DDR4 DIMM memory device connector during shipping, when the DDR4 DIMM memory device is added or replaced in the memory system by a user, and/or in a variety of other scenarios known in the art. Such improper seating of DDR4 DIMM memory devices in DDR4 DIMM memory device connectors raises the possibility of introducing a short across the pin in the DDR4 DIMM memory device connector that is connected to the high voltage rail (e.g., the 12V rail) and adjacent pins in the DDR4 DIMM memory device connector (e.g., the pins connected to the VREF rail and/or ground in DDR4 DIMM memory systems.) The introduction of a short including a pin in the memory device connector that is connected to the high voltage rail can be detrimental to the memory device, the motherboard, the chipset, and/or a variety of other IHS components in the IHS.

Accordingly, it would be desirable to provide an improved memory system.

SUMMARY

According to one embodiment, memory short protection systems and methods include an information handling system (IHS) having a power supply system with a first power rail; a processing system coupled to the power supply system; a memory system that is coupled to the processing system and that includes a memory device connector that is configured to couple to a memory device, wherein the memory device connector includes a first pin that is coupled to the first power rail, and a second pin that is located adjacent the first pin; and a short detection circuit coupled to the first pin, wherein the short detection circuit is configured to: provide a first voltage from the first power rail; compare the first voltage to a first short detection voltage; determine whether a short exists across the first pin and the second pin based on the comparing of the first voltage to the first short detection voltage; and prevent power from being provided to the memory device connector in response to determining a short exists across the first pin and the second pin.

BRIEF DESCRIPTION OF THE DRAWINGS

FIG. 2b is a front view illustrating an embodiment of connectors on the memory device of FIG. 2a.

FIG. 2c is a rear view illustrating an embodiment of connectors on the rear of the memory device of FIG. 2a.

FIG. 3b is a front view illustrating an embodiment of pins on the memory device connector of FIG. 3a.

FIG. 3c is a rear view illustrating an embodiment of pins on the memory device connector of FIG. 3a.

FIG. 7b is a schematic view illustrating an embodiment of the portion of the short detection circuit of FIG. 5a.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
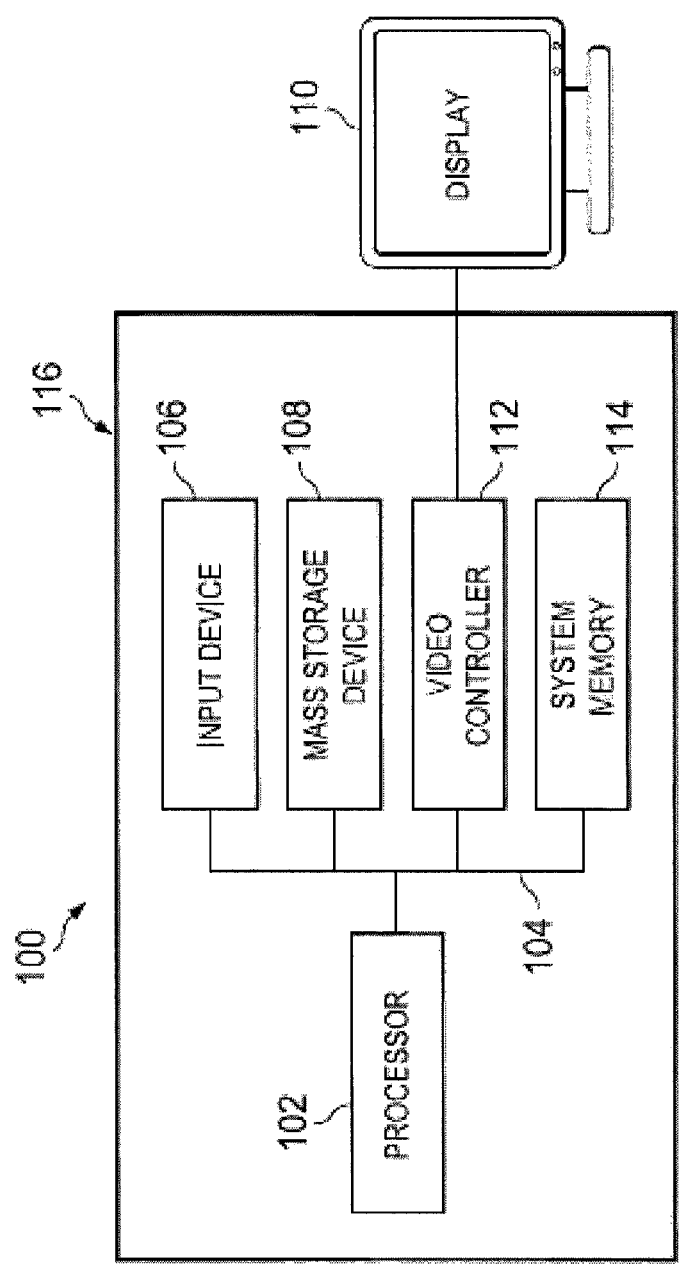
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
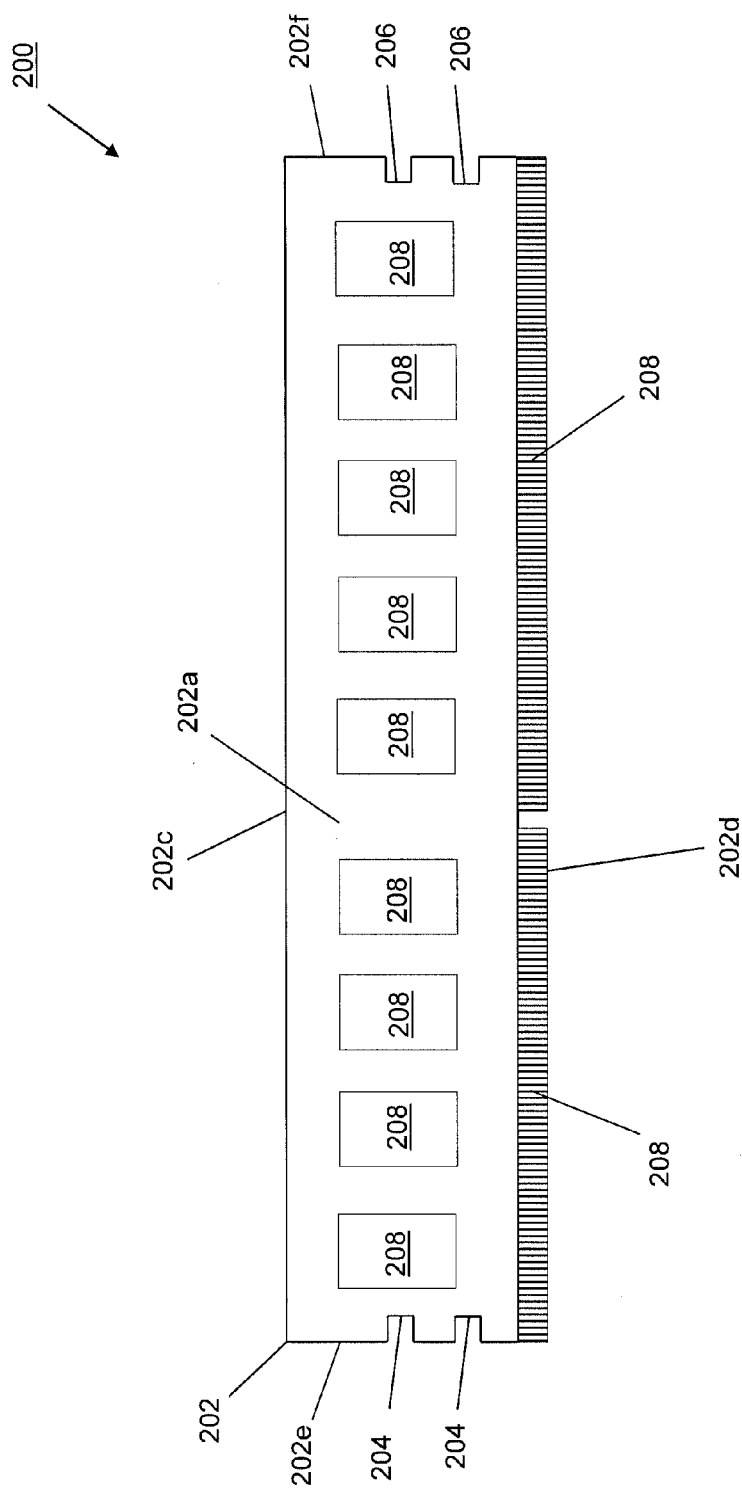
FIG. 2a is a front view illustrating an embodiment of a memory device.
Figure 2B:
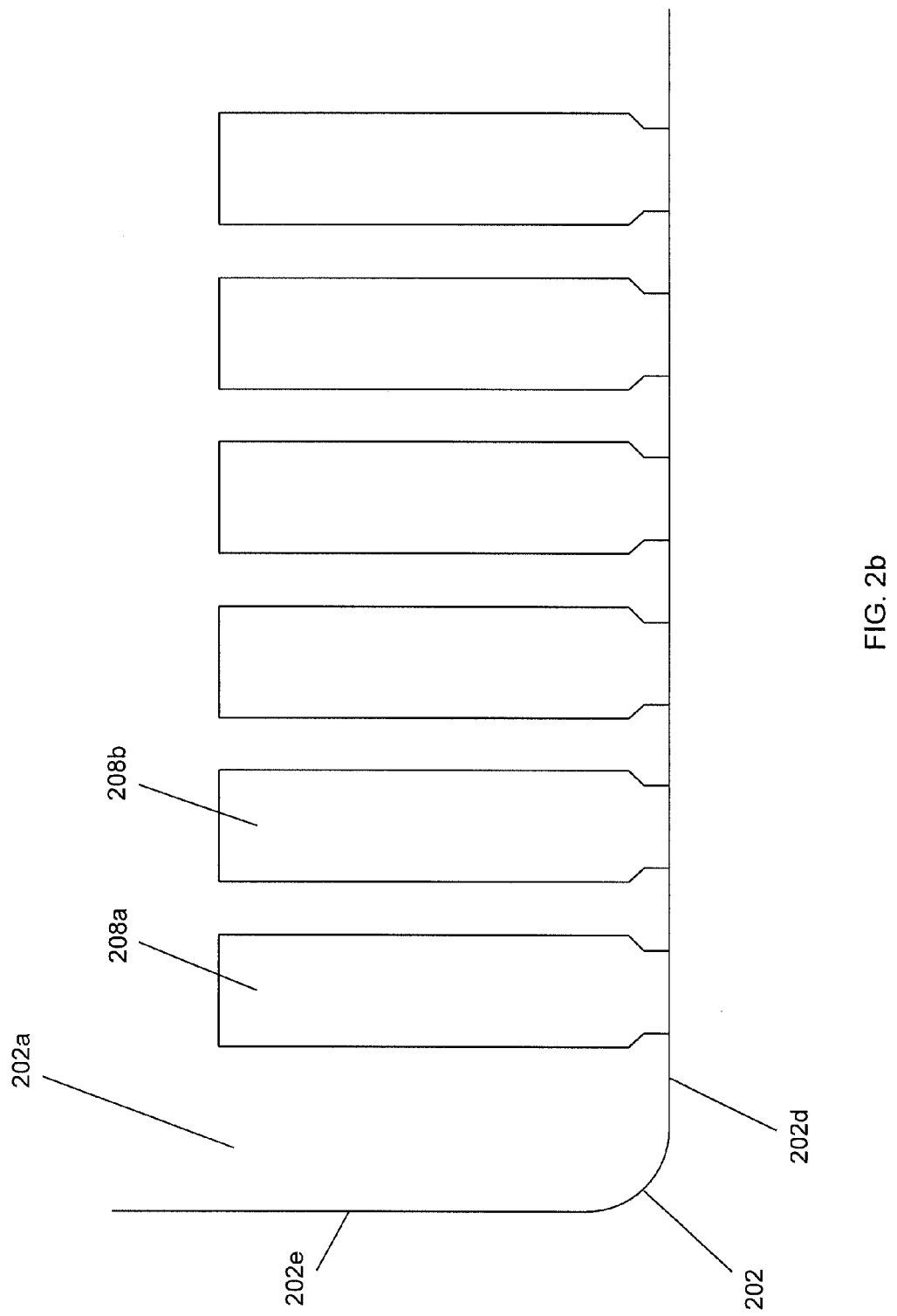
Figure 2C:
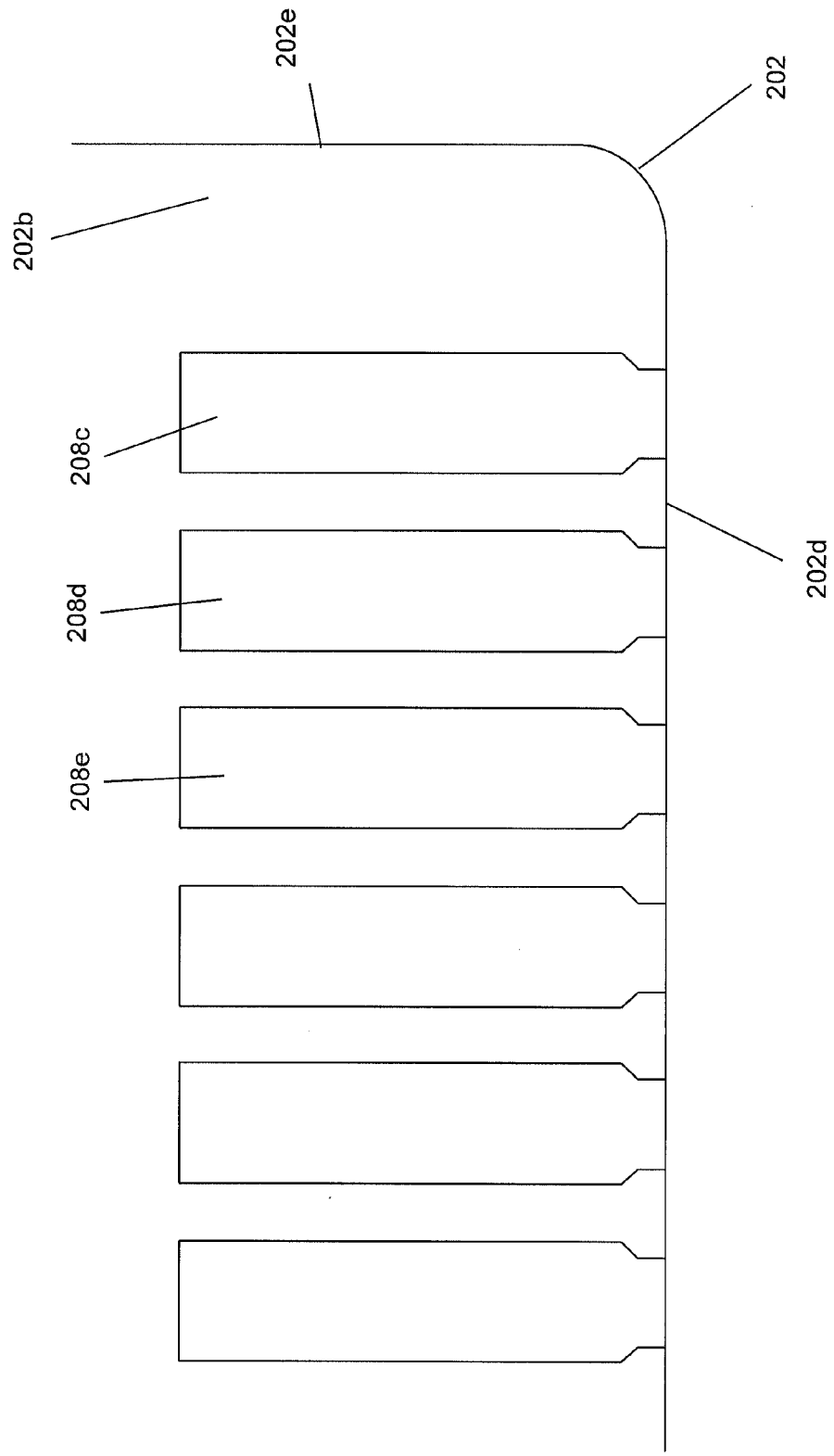

Referring now to FIGS. 2a, 2b, and 2c, an embodiment of a memory device 200 is illustrated. The memory device 200 may be included in the system memory 114 of the IHS 100, discussed above with reference to FIG. 1. In the embodiments discussed below, the memory device 200 is a Double Data Rate fourth generation (DDR4) Dual In-line Memory Module (DIMM) memory device that utilizes 12V, VREF, and ground pins on a memory device connector, discussed below, and has the capability of being improperly seated in that memory device connector such that a short is introduced across a 12V pin and either or both of a VREF pin and a ground pin on the memory device connector. However, one of skill in the art in possession of the present disclosure will recognize that a wide variety of devices and device connectors may benefit from the teachings of the present disclosure, and thus will fall within its scope. The memory device 200 includes a base 202 that may include a circuit board or other memory device base known in the art. The base 202 includes a front surface 202a, a rear surface 202b located opposite the base 202 from the front surface 202a, a top edge 202c extending between the front surface 202a and the rear surface 202b, a bottom edge 202d extending between the front surface 202a and the rear surface 202b and located opposite the base 202 from the top edge 202c, and a pair of side edges 202e and 202f that extend between the front surface 202a, the rear surface 202b, the top edge 202c, and the bottom edge 202d, and that are located opposite the base 202 from each other.

A plurality of connector coupling features 204 are defined on the side edge 202e of the base 202, and a plurality of connector coupling features 206 are defined on the side edge 202f of the base 202. A plurality of memory components 208 are mounted to the base 202, and may include memory chips, processors, and/or a variety of other memory components known in the art. A plurality of memory device connections 208 are located adjacent the bottom edge 202d of the base 202. FIG. 2b illustrates and embodiment of memory device connections 208 on the front surface 202a of a DDR4 DIMM memory device 200 that include a memory device 12V connection 208a and a memory device ground connection 208b. FIG. 2c illustrates and embodiment of memory device connections 208 on the rear surface 202b of a DDR4 DIMM memory device 200 that include a memory device 12V connection 208c, a memory device VREF connection 208d, and a memory device ground connection 208e. While a specific memory device connection configuration for a DDR4 DIMM memory device is illustrated and described herein, one of skill in the art in possession of the present disclosure will recognize that other memory device connector configurations for other memory systems will benefit from the teachings of the present disclosure and with thus fall within its scope.

Figure 3A:
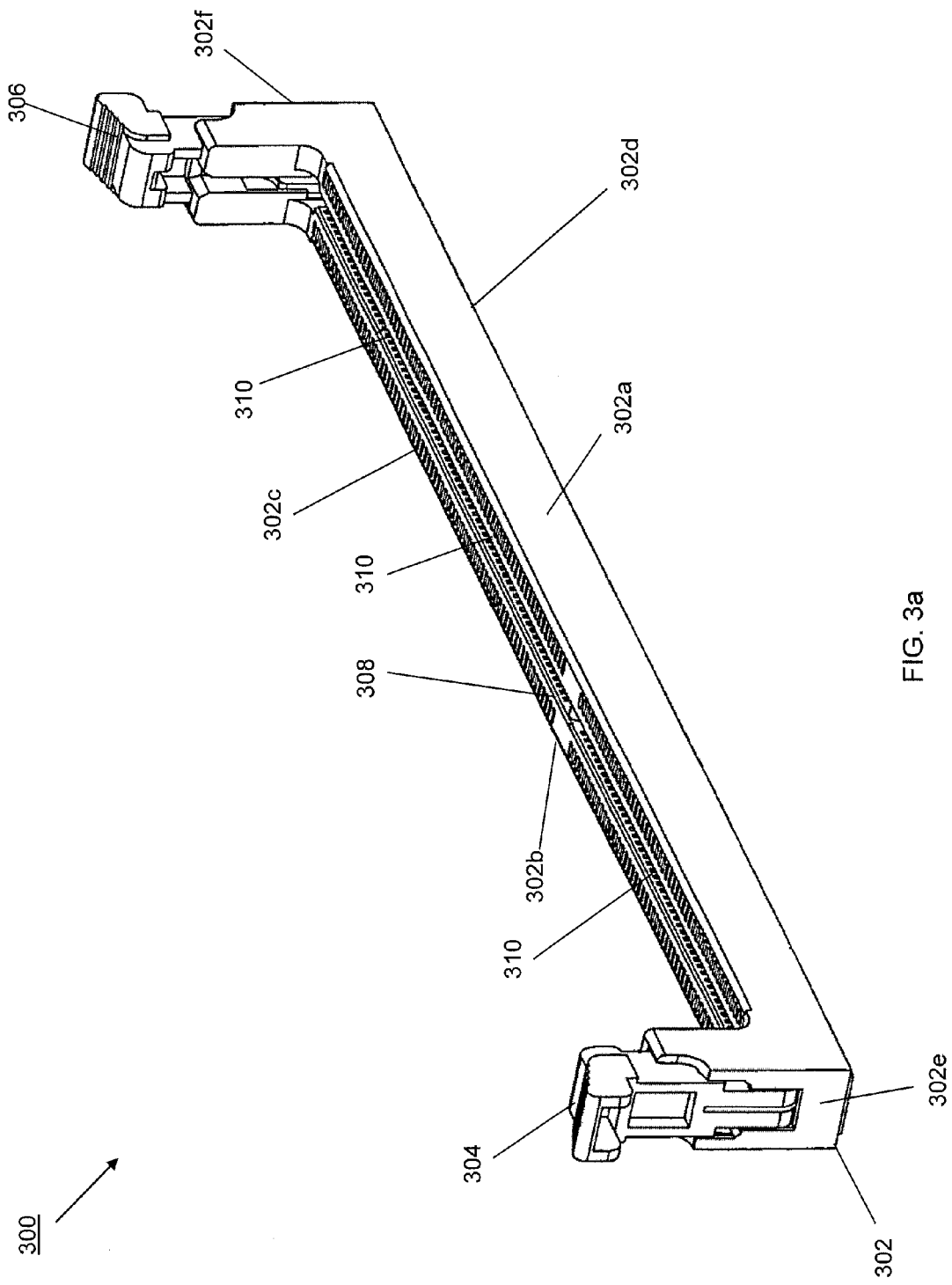
FIG. 3a is a perspective view illustrating an embodiment of a memory device connector.
Figure 3B:
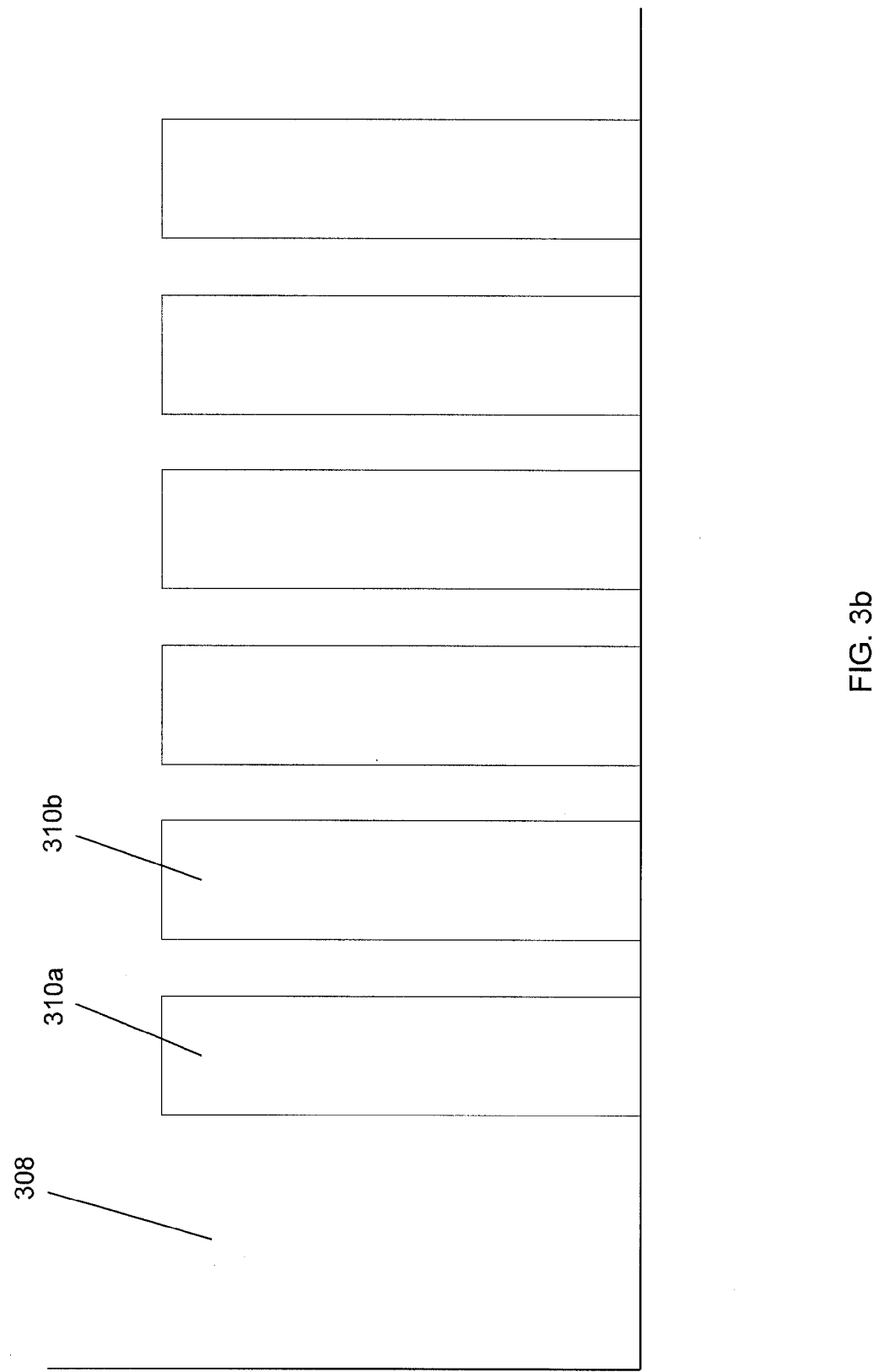
Figure 3C:
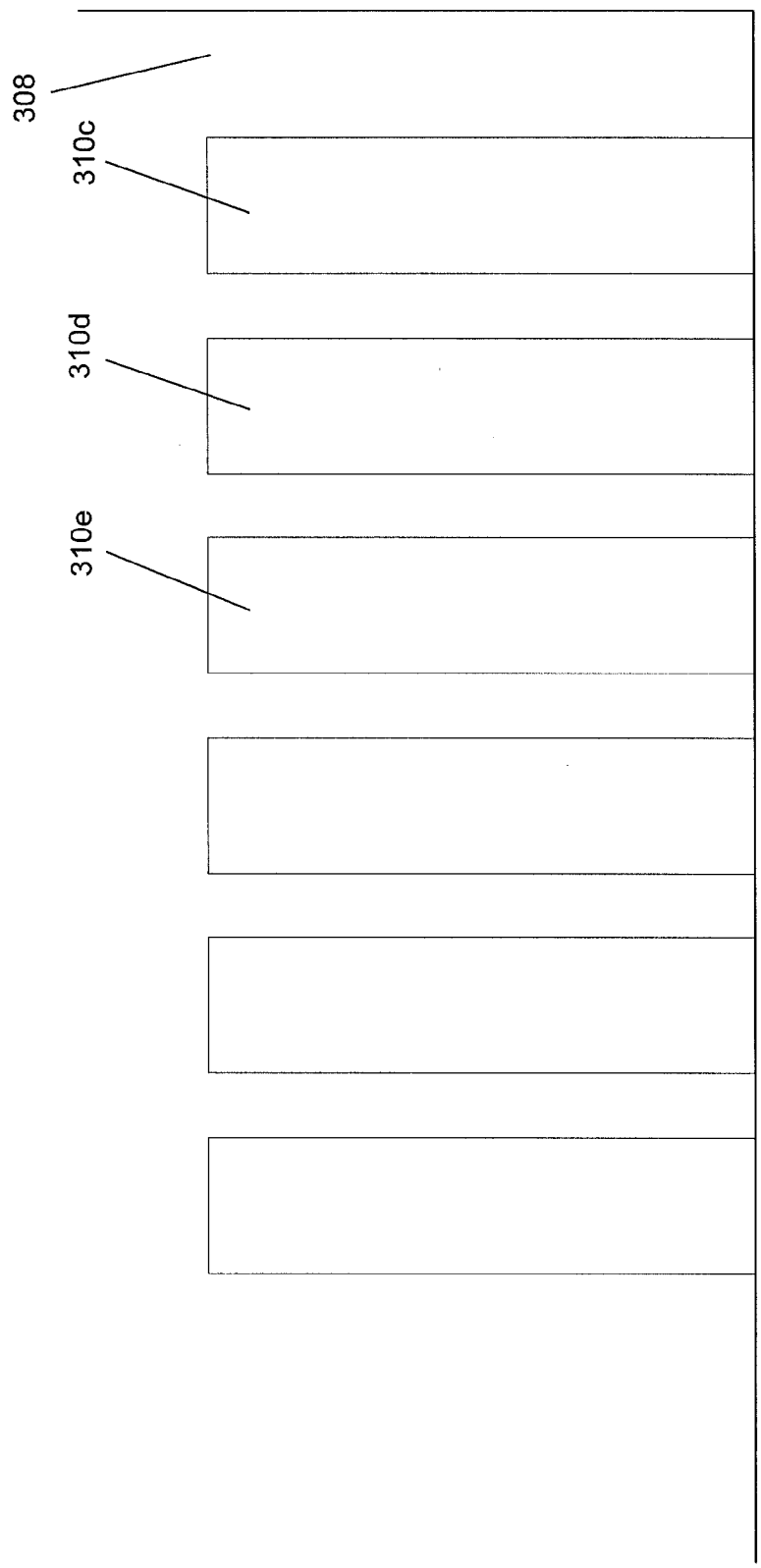

Referring now to FIGS. 3a, 3b, and 3c an embodiment of a memory device connector 300 is illustrated. The memory device connector 300 may be included in the system memory 114 of the IHS 100, discussed above with reference to FIG. 1. In the embodiments discussed below, the memory device connector 300 is a Double Data Rate fourth generation (DDR4) Dual In-line Memory Module (DIMM) memory device connector that includes 12V, VREF, and ground pins that may allow a memory device (e.g., the memory device 200) to introduce a short across a 12V pin and either or both of a VREF pin and a ground pin on the memory device connector. However, one of skill in the art in possession of the present disclosure will recognize that a wide variety of devices and device connectors may benefit from the teachings of the present disclosure, and thus will fall within its scope. The memory device connector 300 includes a base 302 having a front surface 302*a*, a rear surface 302*b* located opposite the base 302 from the front surface 302*a*, a top surface 302*c* extending between the front surface 302*a* and the rear surface 302*b*, a bottom surface 302*d* extending between the front surface 302*a* and the rear surface 302*b* and located opposite the base 302 from the top surface 302*c*, and a pair of side surfaces 302*e* and 302*f* that extend between the front surface 302*a*, the rear surface 302*b*, and the bottom surface 302*d*, and that are located opposite the base 302 from each other.

A memory device connector member 304 extends from the base 302 adjacent the side edge 302*e*, and a memory device connector member 306 extends from the base 302 adjacent the side edge 302*f*. While not described in detail, the memory device connector members 304 and 306 may be moveably coupled to the base 302 and configured to secure a memory device (e.g., the memory device 200) to the memory device connector 300. A memory device channel 308 is defined by the base 302 and includes an entrance on the top surface 302*c* of the base 302 that extends substantially between the side surfaces 302*e* and 302*f*. A plurality of memory connector pins 310 are located adjacent the memory device channel 308. FIG. 3*b* illustrates and embodiment of memory connector pins 310 adjacent a first side of a memory device channel 308 in a DDR4 DIMM memory device connector 300 that include a memory connector 12V pin 310*a* and a memory connector ground pin 310*b*. FIG. 3*c* illustrates and embodiment of memory connector pins 310 adjacent a second side of a memory device channel 308 in a DDR4 DIMM memory device connector 300 that include a memory connector 12V pin 310*c*, a memory connector VREF pin 310*d*, and a memory connector ground pin 310*e*. While a specific memory connector pin configuration for a DDR4 DIMM memory device connector is illustrated and described below, one of skill in the art in possession of the present disclosure will recognize that other memory connector pin configurations for other memory systems will benefit from the teachings of the present disclosure and with thus fall within its scope.

Figure 4:
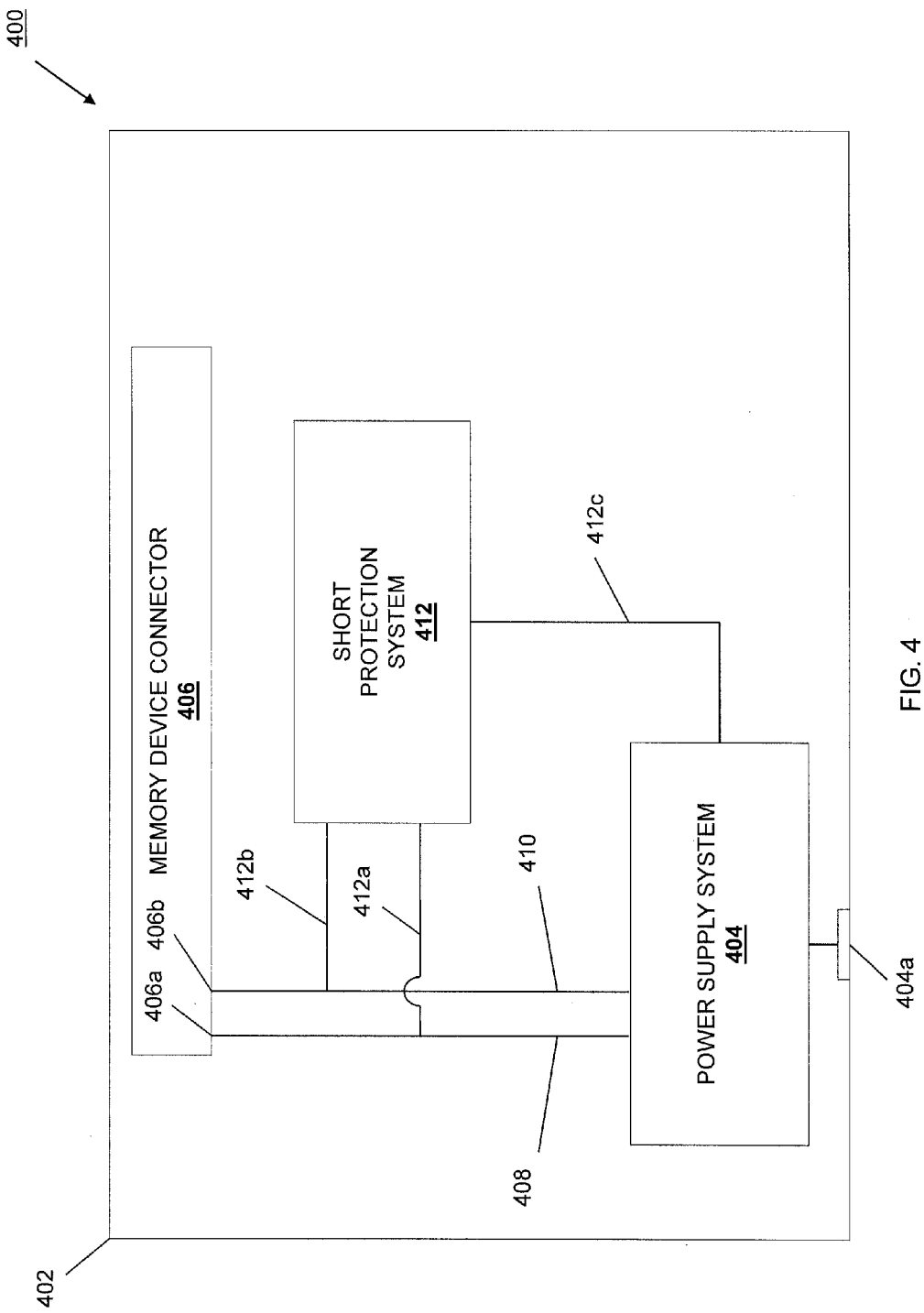
FIG. 4 is a schematic view illustrating an embodiment of an IHS.

Referring now to FIG. 4, an embodiment of an IHS 400 is illustrated. In an embodiment, the IHS 400 may be the IHS 100, discussed above with reference to FIG. 1, and/or may include some or all of the components of the IHS 100. The IHS 400 includes a chassis 402 that houses a power supply system 404 that is coupled to a power connector 406 that is accessible on an outer surface of the chassis 402. In an embodiment, the power supply system 404 is a 12V power supply system and the power connector 404*a* is configured to couple the power supply system 404 to an Alternating Current (AC) power source via, for example, a conventional wall plug. In addition, the power supply system 404 may include a battery that may provide power for the IHS 400 and/or may be recharged via the power connector 404*a*. While a few examples have been provided, one of skill in the art will recognize that a wide variety of power supply systems will fall within the scope of the present disclosure.

The chassis 402 also houses a memory device connector 406 that includes a first pin 406*a* and a second pin 406*b*, and that may be the memory device connector 300 discussed above with reference to FIG. 3. In the illustrated embodiment, the power supply system 404 is coupled to the memory device connector 300 by each of a first power rail 408 coupled to the first pin 406*a* and a second power rail 410 coupled to the second pin 406*b*. For example, with reference to each of FIGS. 3*a*, 3*b*, and 4, the first power rail 408 may be a 12V power rail that provides 12 volts of power and that is coupled to the memory connector 12V pin 406*a*/310*b* on the memory device connector 406/300, while the second power rail 410 is a VREF power rail that provides 0.6 volts of power and that is coupled to the memory connector VREF pin 406*b*/310*c* on the memory device connector 406/300. While a specific example has been provided, one of skill in the art in possession of the present disclosure will recognize that other connections between the power supply system 404 and the memory device connector 300/406, different power amounts supplied on the connections between the power supply system 404 and the memory device connector 300/406, and/or a variety of other modifications, will fall within the scope of the present disclosure.

A short protection system 412 is coupled to the first pin 406*a* via a connection 412*a* to the first power rail 408, and coupled to the second pin 406*b* via a connection 412*b* to the second power rail 410. The short protection system 412 may also be coupled to the power supply system 404 through a third connection 412*c*. In one or more embodiments, the third connection 412*c* may provide an auxiliary voltage from the power supply system 404 to the short protection system 412, control signals from the short protection system 412 to the power supply system 404, and/or a variety of other functionality discussed below. In other embodiments, the third connection 412*c* may be used by the IHS or a user to configure, enable, and/or power the short protection system 412. In an embodiment, the IHS 400 may include a processing system (e.g., an auxiliary processor in the IHS 100 discussed above with reference to FIG. 1 that operates when the system processor 102 of the IHS 100 has not received power yet) that may execute stored instructions to provide a short protection engine in the short protection system 412 that operates to perform the functions of the short protection engines discussed below. As discussed below, the short protection system 412 includes a detection component that operates to detect shorts, and then the short protection system 412 (e.g., the short protection engine) operates to ensure that the IHS is protected. While these detection and protection functions are illustrated and described as being parts of the same component, one of skill in the art will recognize that they may be separated into two discrete components (e.g., circuits) while remaining within the scope of the present disclosure. A specific embodiment of the short protection system 412 that compares voltages provided from the first power rail 408 and the second power rail 410 to predetermined short detection voltages is described in detail below. However, one of skill in the art in possession of the present disclosure will recognize that other embodiments of the short protection system 412 may compare other power characteristics (e.g., currents) provided from the first power rail 408 and the second power rail 410 to predetermined short detection power characteristics (e.g., currents) while remaining within the scope of the present disclosure.

Figure 5A:
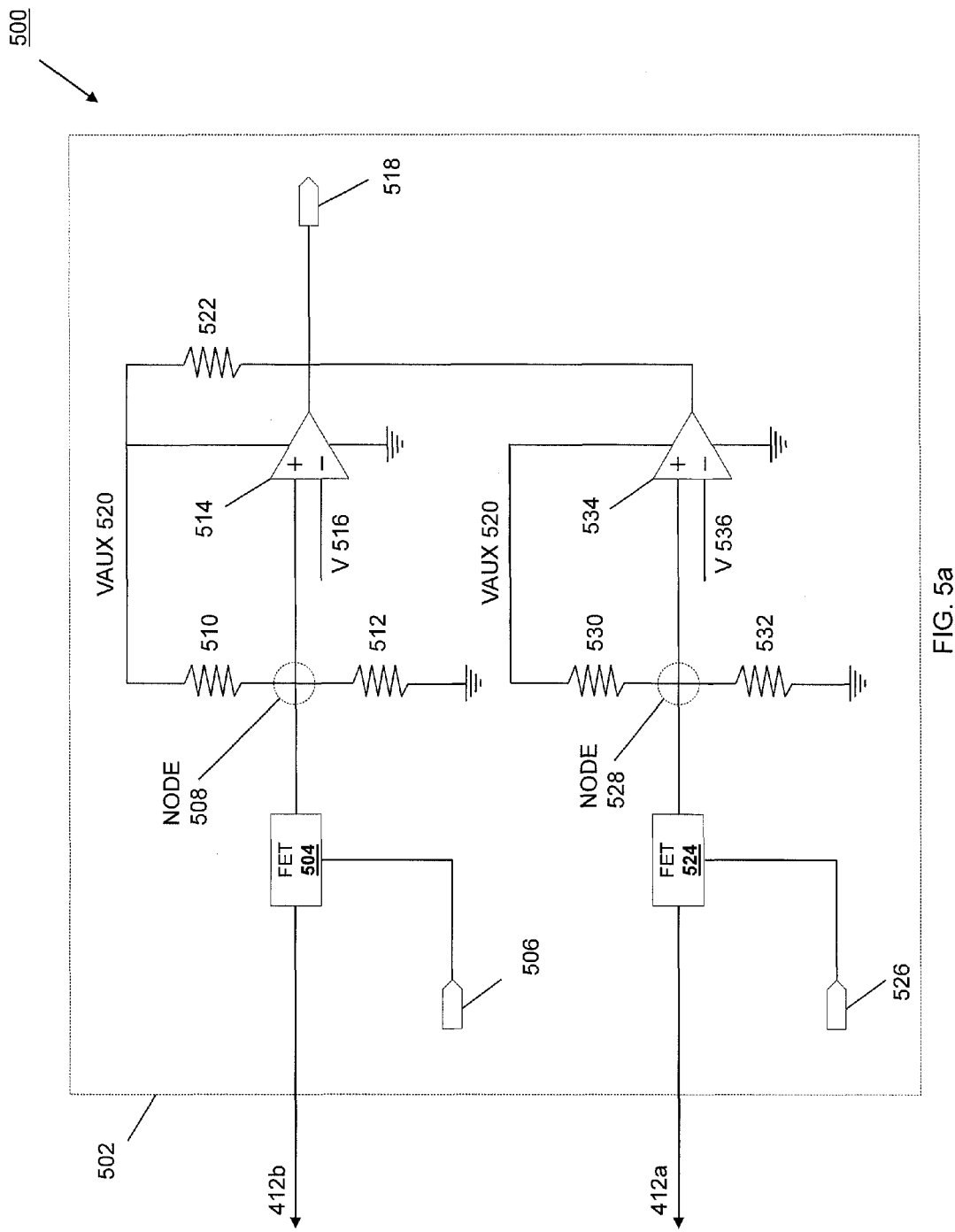
FIG. 5a is a schematic view illustrating an embodiment of a portion of a short detection circuit in the short protection system of FIG. 4.

Referring now to FIG. 5*a*, and with reference to FIG. 4, an embodiment of a portion of a short protection system 500 is illustrated. The short protection system 500 may be the short protection system 412 discussed above with reference to FIG. 4. In the illustrated embodiment, the short protection system 500 includes a short detection circuit 502 that is coupled to each of the first pin 406*a* on the memory device connector 406 via the connection 412*a* to the first power rail 408, and coupled to the second pin 406*b* on the memory device connector 406 via the connection 412*b* to the second power rail 410. An isolation device 504 such as, for example, a Field Effect Transistor (FET), is coupled to the connection 412*b*, to a short detection activation device 506, and to a node 508. The node 508 is connected to each of a resistor 510, a resistor 512, and an input to a comparator 514. A short detection voltage 516 is also provided as an input to the comparator 514. The comparator 514 outputs to a short reporting device 518. The comparator 514 is coupled to auxiliary voltage 520 (e.g., V_3P3AUX from the power supply system 404), a resistor 522, and ground, in order to receive power. An isolation device 524 such as, for example, a FET, is coupled to the connection 412a, to a short detection activation device 526, and to a node 528. The node 528 is connected to each of a resistor 530, a resistor 532, and an input to a comparator 534. A short detection voltage 536 is also provided as an input to the comparator 534. The comparator 534 outputs to the short reporting device 518. The comparator 532 is coupled to auxiliary voltage 520 (e.g., V_3P3AUX from the power supply system 404), the resistor 522, and ground, in order to receive power. In an embodiment, the resistors 510 and 512 provide a resistor network that is configured to produce an expected voltage at the node 508 during operation of the short detection circuit 502, discussed in further detail below. Similarly, in an embodiment, the resistors 530 and 532 provide a resistor network that is configured to produce an expected voltage at the node 528, discussed in further detail below.

While a specific example of the short protection system 500 including the detailed short detection circuit 502 has been illustrated and, one of skill in the art will recognize that a wide variety of circuits and circuit components may be used to provide the functionality discussed below, and thus will fall within the scope of the present disclosure. As discussed above, one of skill in the art in possession of the present disclosure will recognize that the short detection circuit 502 may be modified such that other power characteristics (e.g., currents) may be provided from the first power rail 408 and the second power rail 410, along with predetermined short detection power characteristics (e.g., currents), to comparators (similar to the comparators 514 and 534) while remaining within the scope of the present disclosure. Furthermore, while the isolation devices 504 and 524 provide for the isolation of the 12V power rail and VREF power rail, in some embodiments the isolation devices 504 and 524 may be replaced by a variety of switching devices known in the art. In such embodiments, isolation of the 12V power rail and VREF power rail may be implemented through the third connection 412c using methods known in the art. In yet further embodiments, the isolation devices 504 and 524 may be omitted.

Figure 5B:
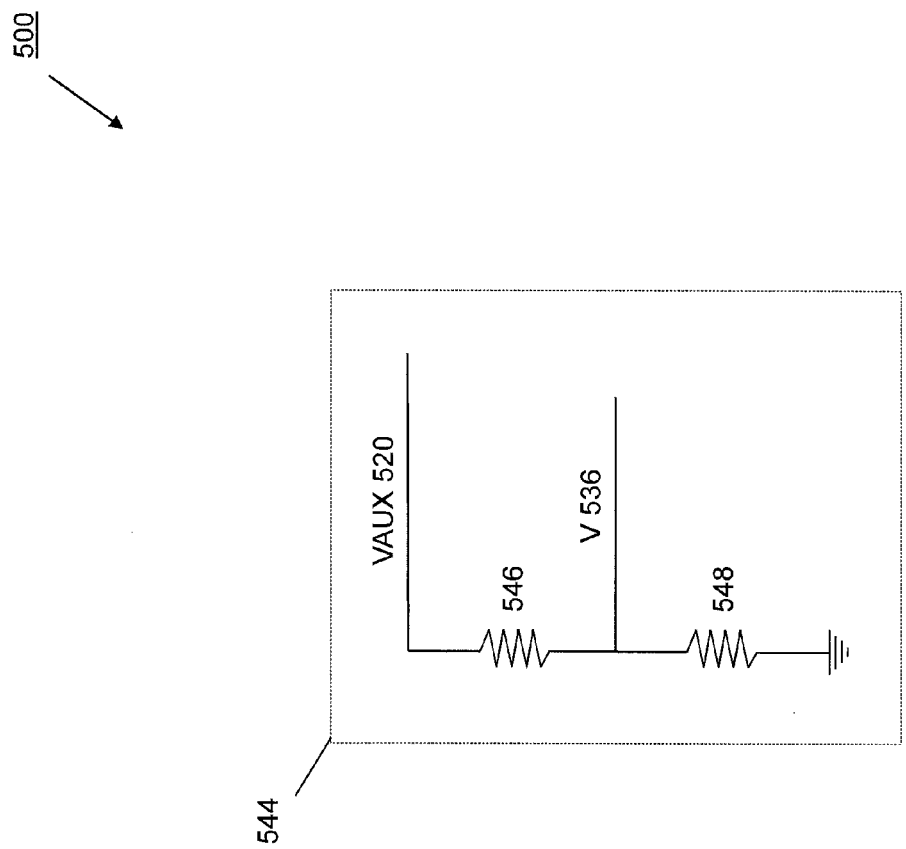
FIG. 5b is a schematic view illustrating an embodiment of a portion of a short detection circuit in the short protection system of FIG. 4.
Figure 5B:
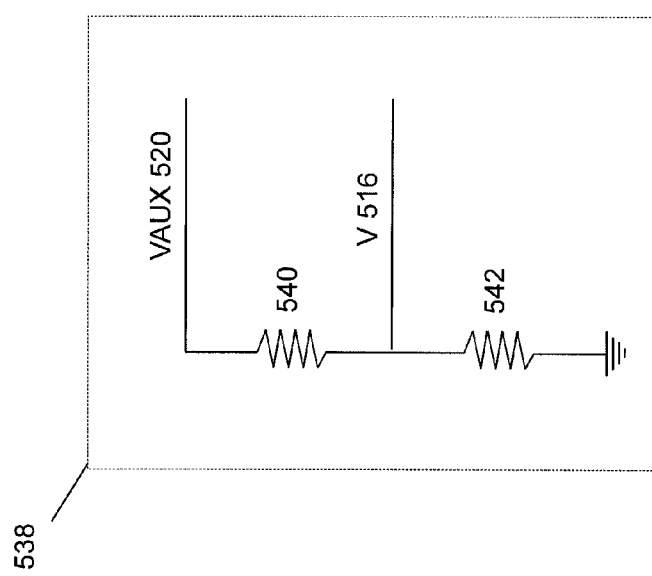

Referring now to FIG. 5b, an embodiment of portions of the short protection system 500 is illustrated. A circuit portion 538 includes a resistor 540 between the auxiliary voltage 520 and the short detection voltage 516, as well as a resistor 542 between the short detection voltage 516 and ground. The circuit portion 538 provides a resistor network that creates the short detection voltage 516 that is input to the comparator 514, and the resistance of the resistors 540 and 542 is selected so that the short detection voltage 516 is less than the voltage at node 508 when no short exists, and greater than the voltage at node 508 when a short exists, both discussed in detail below. Similarly, a circuit portion 544 includes a resistor 546 between the auxiliary voltage 520 and the short detection voltage 536, as well as a resistor 548 between the short detection voltage 536 and ground. The circuit portion 544 provides a resistor network that creates the short detection voltage 536 that is input to the comparator 534, and the resistance of the resistors 546 and 548 is selected so that the short detection voltage 536 is less than the voltage at node 528 when no short exists, and greater than the voltage at node 528 when a short exists, both discussed in detail below. As discussed above, one of skill in the art in possession of the present disclosure will recognize that the circuit portions 538 and 544 may be modified such that predetermined short detection power characteristics other than voltages (e.g., currents) are provided to comparators (similar to the comparators 514 and 534) while remaining within the scope of the present disclosure.

Figure 6:
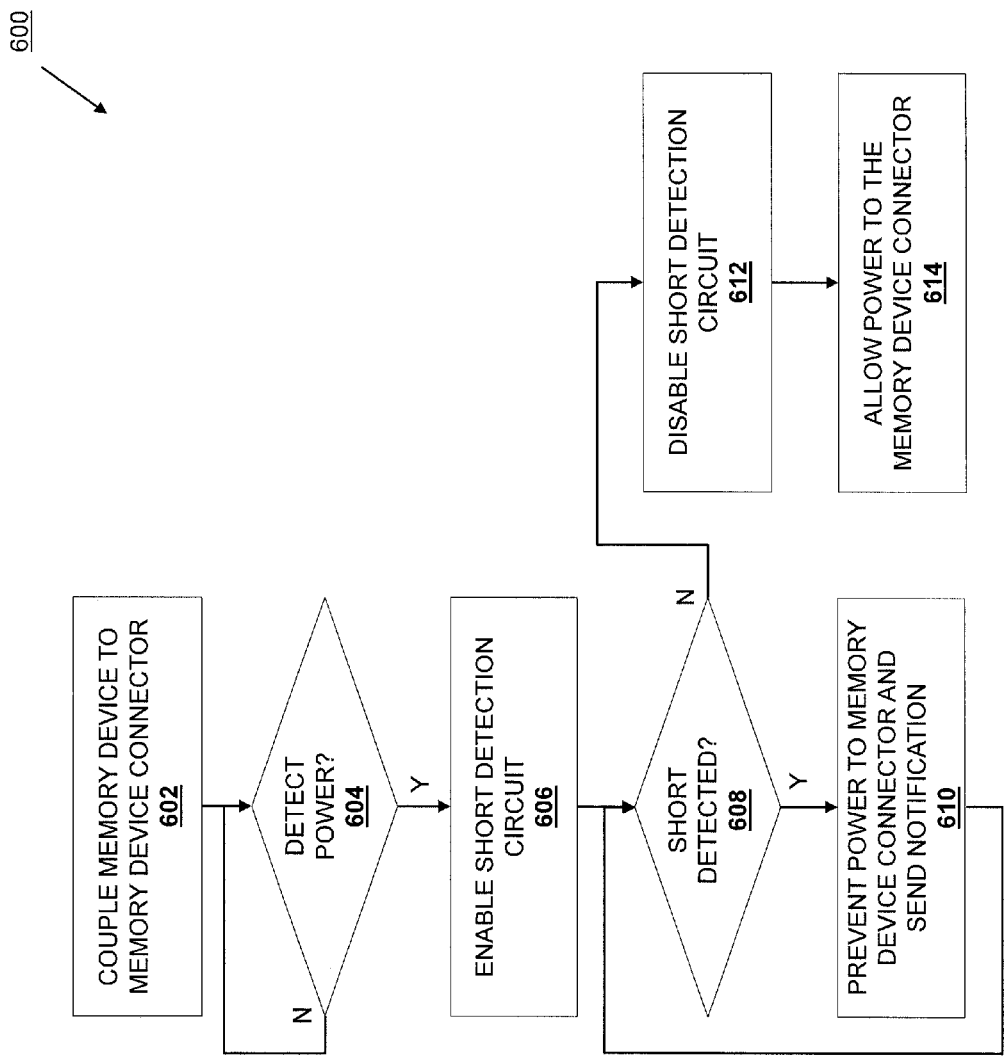
FIG. 6 is a flow chart illustrating an embodiment of a method for protecting from a memory system short.
Figure 7A:
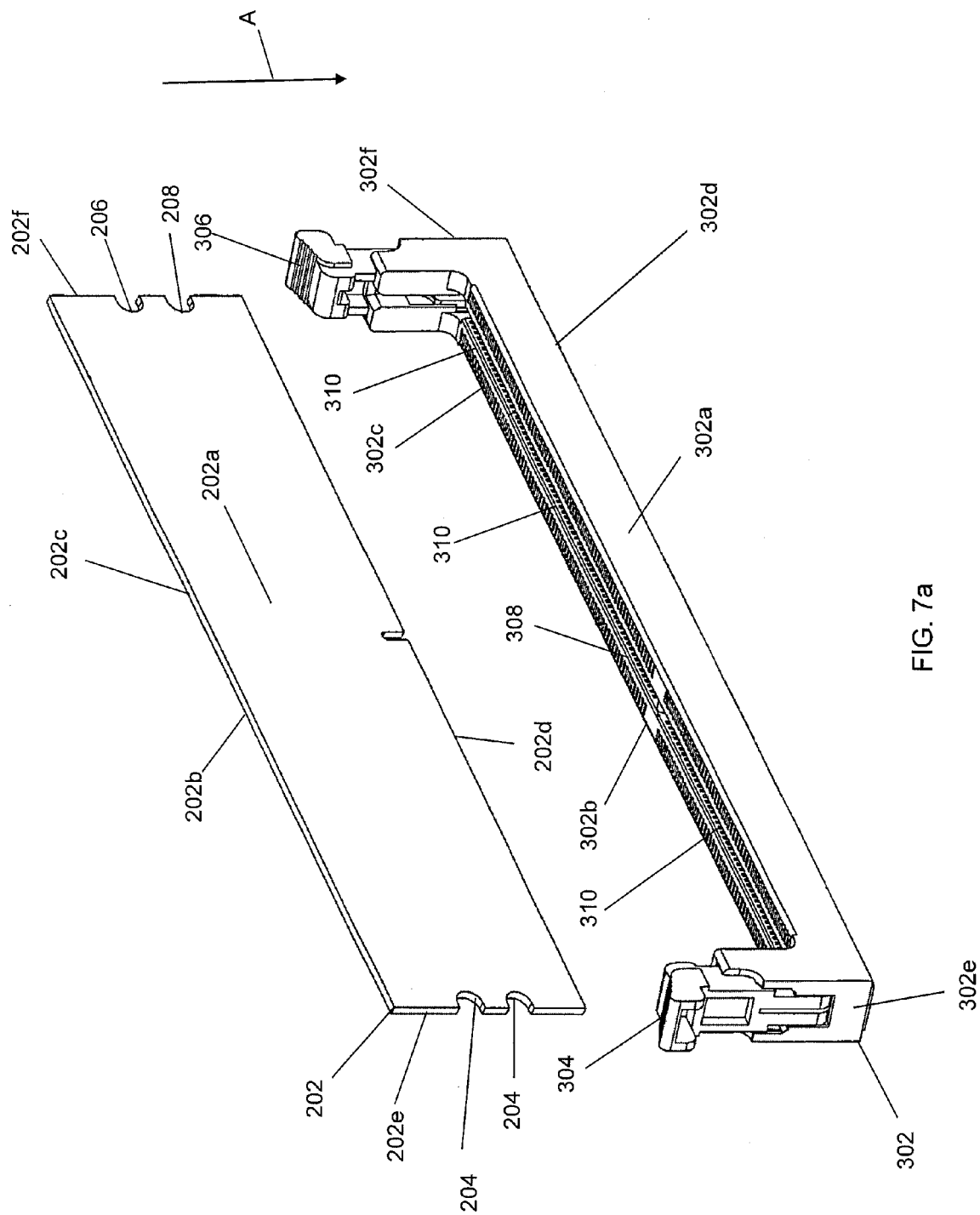
FIG. 7a is a perspective view illustrating an embodiment of the memory device of FIGS. 2a and 2b being coupled to the memory device connector of FIGS. 3a and 3b.

Referring now to FIGS. 6 and 7a, an embodiment of a method 600 for protecting from a memory system short is illustrated. The method 600 begins at block 602 where a memory device is coupled to a memory device connector. FIG. 7a illustrates an embodiment of the memory device 200 of FIGS. 2a and 2b being coupled to the memory device connector 300 of FIGS. 3a and 3b. In an embodiment, the memory device connector 300 may be coupled to a circuit board (e.g., a motherboard in the IHS 100, discussed above with reference to FIG. 1) by mounting the bottom surface 302d of the base 302 to the circuit board such that the memory device connector pins 310 in the memory device channel 308 are coupled to devices on the circuit board (e.g., the processor 102 discussed above with reference to FIG. 1) to provide a memory system. The user may then position the memory device 200 adjacent the memory device connector 300 such that the bottom edge 202d of the memory device 200 is located adjacent to and aligned with the memory device channel 308, the connector coupling features 204 are located adjacent the memory device connector member 304, and the connector coupling features 206 are located adjacent the memory device connector member 306, as illustrated in FIG. 7a. To couple the memory device 200 to the memory device connector 300, the user then moves the memory device 200 in a direction A until the memory device connections 208 on the memory device 200 enter the memory device channel 308 on the memory device connector 300 and engage the memory device connector pins 310. Movement of the memory device 200 in such a manner may cause the memory device connector members 304 and 306 to engage the connector coupling features 204, and 206, respectively, to secure the memory device 200 to the memory connector 300.

The method 600 then proceeds to decision block 604 where it is determined whether power is detected. Referring to FIG. 4, at decision block 604 the short protection system 412 may operate (e.g., via the connection 412c and a short protection engine, discussed above) to determine whether the power supply system 404 has been coupled to an AC power source (e.g., via the power connector 404a), has been activated, or is otherwise able to supply power to the memory device connector 406. If at decision block 604, the short protection system 412 does not detect power, the method 600 returns to decision block 604 to continue to determine whether power is detected. If at decision block 604, the short protection system 412 detects power, the method 600 proceeds to block 606 where the short detection circuit is enabled. In an embodiment, the short protection engine may enable the short detection circuit 502 by activating the short detection activation devices 506 and 526 (e.g., by providing a high (1) signal on each of the short detection activation device 506 and 526) in order to enable the isolation device 504 and the isolation device 524, respectively.

Figure 7B:
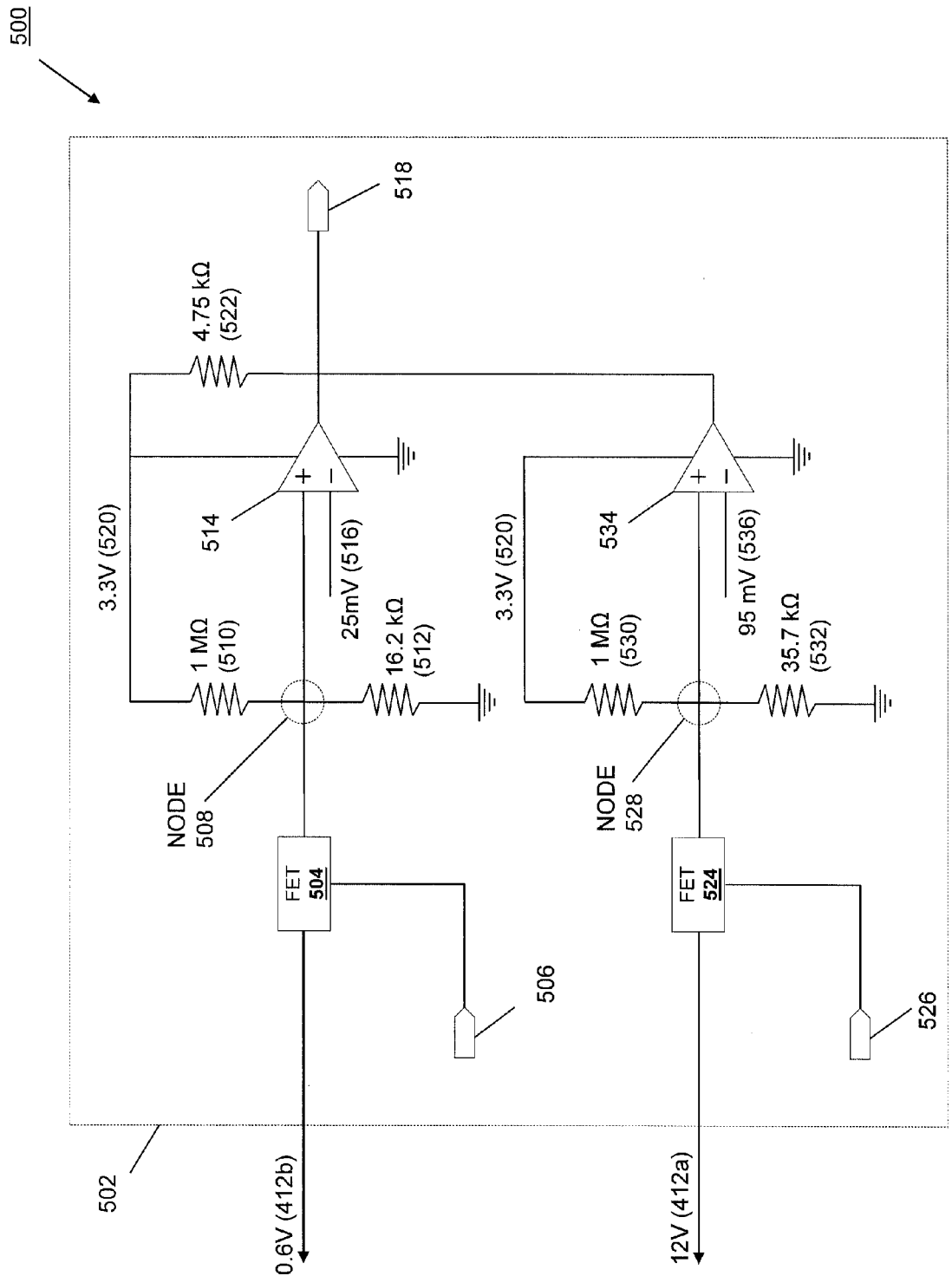
Figure 7C:
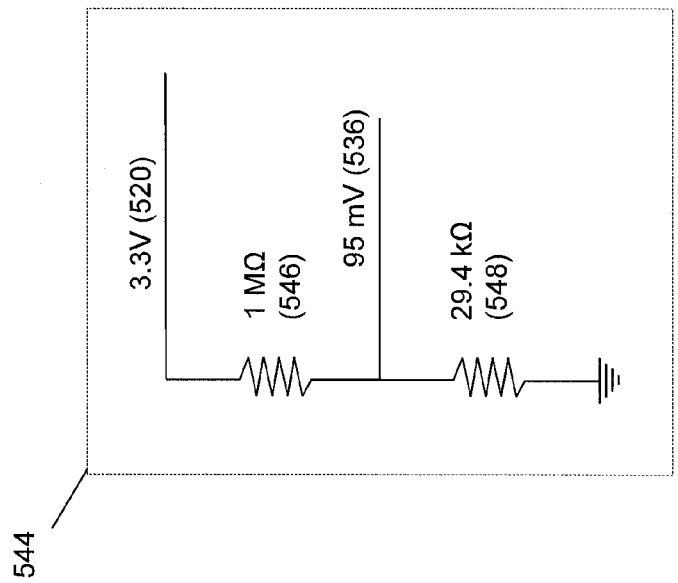
FIG. 7c is a schematic view illustrating an embodiment of the portion of the short detection circuit of FIG. 5b.
Figure 7C:
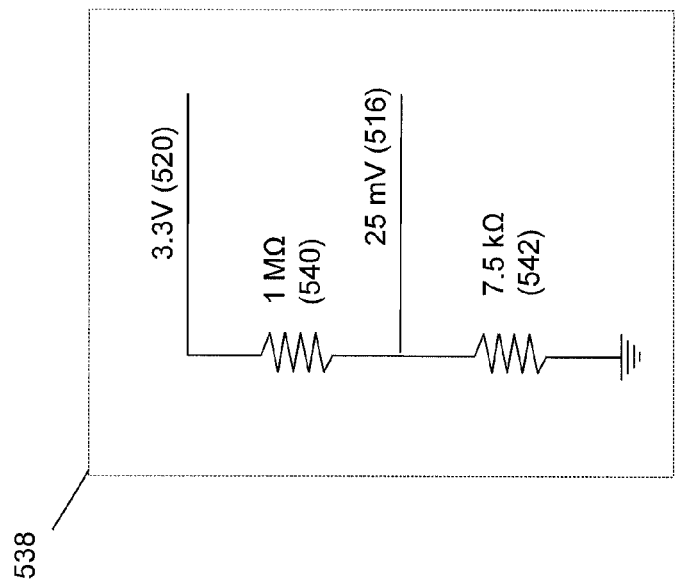

In an embodiment, the enablement of the isolation devices 504 and 524 causes the isolation device 504 to provide a short detection voltage from the first power rail 408 to the node 508, and causes the isolation device 524 to provide a short detection voltage from the second power rail 410 to the node 528. In an embodiment, the short detection voltages provided to the nodes 508 and 528 may be selected such that they are not high enough to damage any components in the memory system or the IHS 400. For example, the isolation devices 504 and 524 may operate to apply minimal voltages (e.g., less than 150 mV) to the unpowered first power rail 408 and second power rail 410. Referring to FIG. 7b, a specific embodiment of the short detection circuit 502 in the short protection system 500 of FIG. 5a is illustrated. In that embodiment, the connection 412b is coupled to a VREF power rail that is configured to provide 0.6 volts of power from the power supply system 404, the connection 412a is coupled to a 12V power rail that is configured to provide 12 volts of power from the power supply system 404, and the auxiliary voltage 520 is configured as providing 3.3 volts) The illustrated embodiment also include 1 MΩ resistors for the resistors 510 and 530, a 16.2 kΩ resistor as the resistor 512, a 35.7 kΩ resistor as the resistor 532, and a 4.75 kΩ resistor as the resistor 522. The illustrated embodiment also includes a short detection voltage 516 of 25 mV, and a short detection voltage 536 of 95 mV. The embodiment of the short detection circuit 502 in the short protection system 500 illustrated in FIG. 7b will be used below to describe an example of detecting a short in the memory system, but one of skill in the art in possession of the present disclosure will recognize that the short detection circuit components may vary in arrangement, size, and characteristics while remaining within the scope of the present disclosure.

Figure 7D:
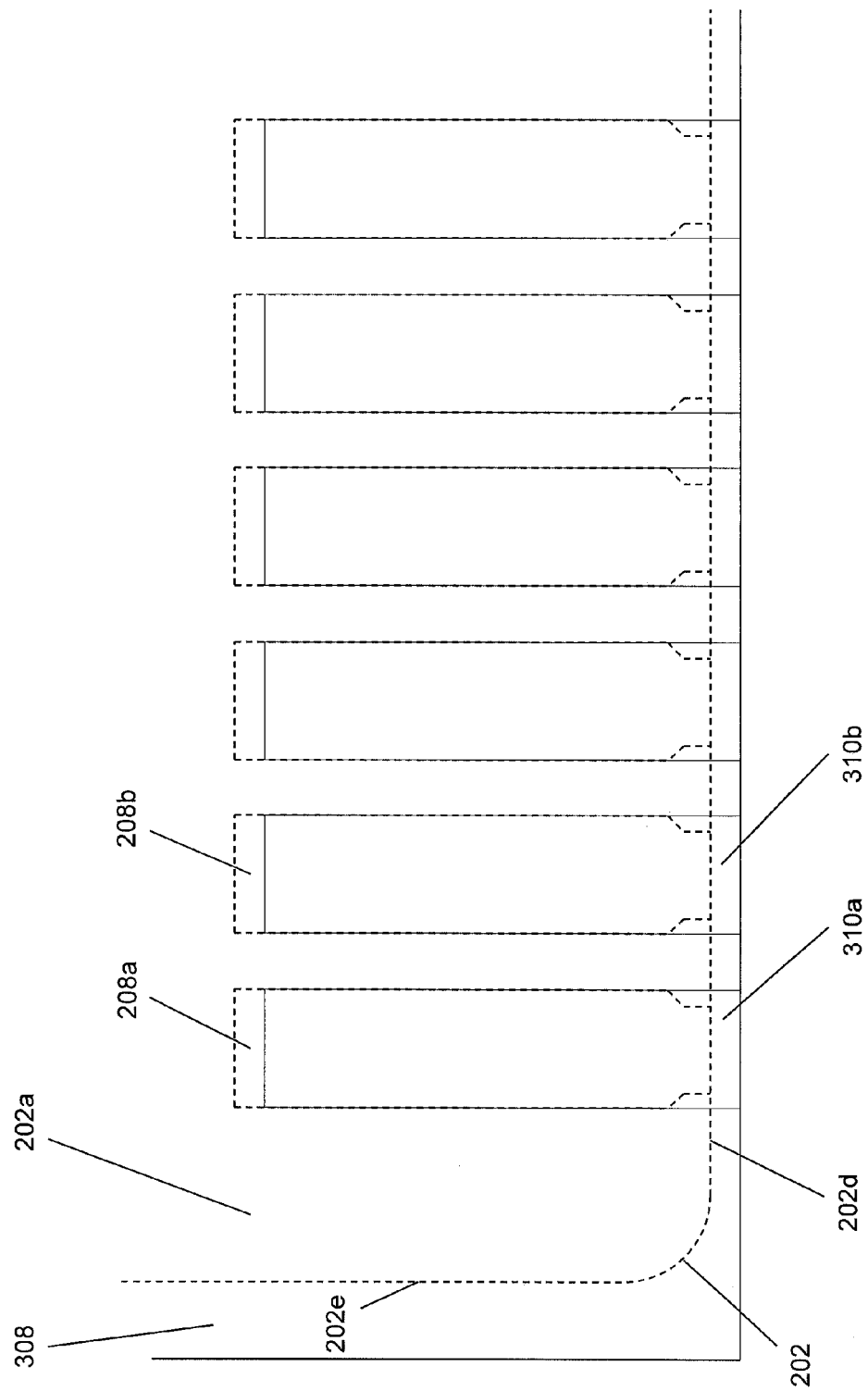
FIG. 7d is a front view illustrating an embodiment of the memory device of FIGS. 2a and 2b properly seated in the memory device connector of FIGS. 3a and 3b.
Figure 7E:
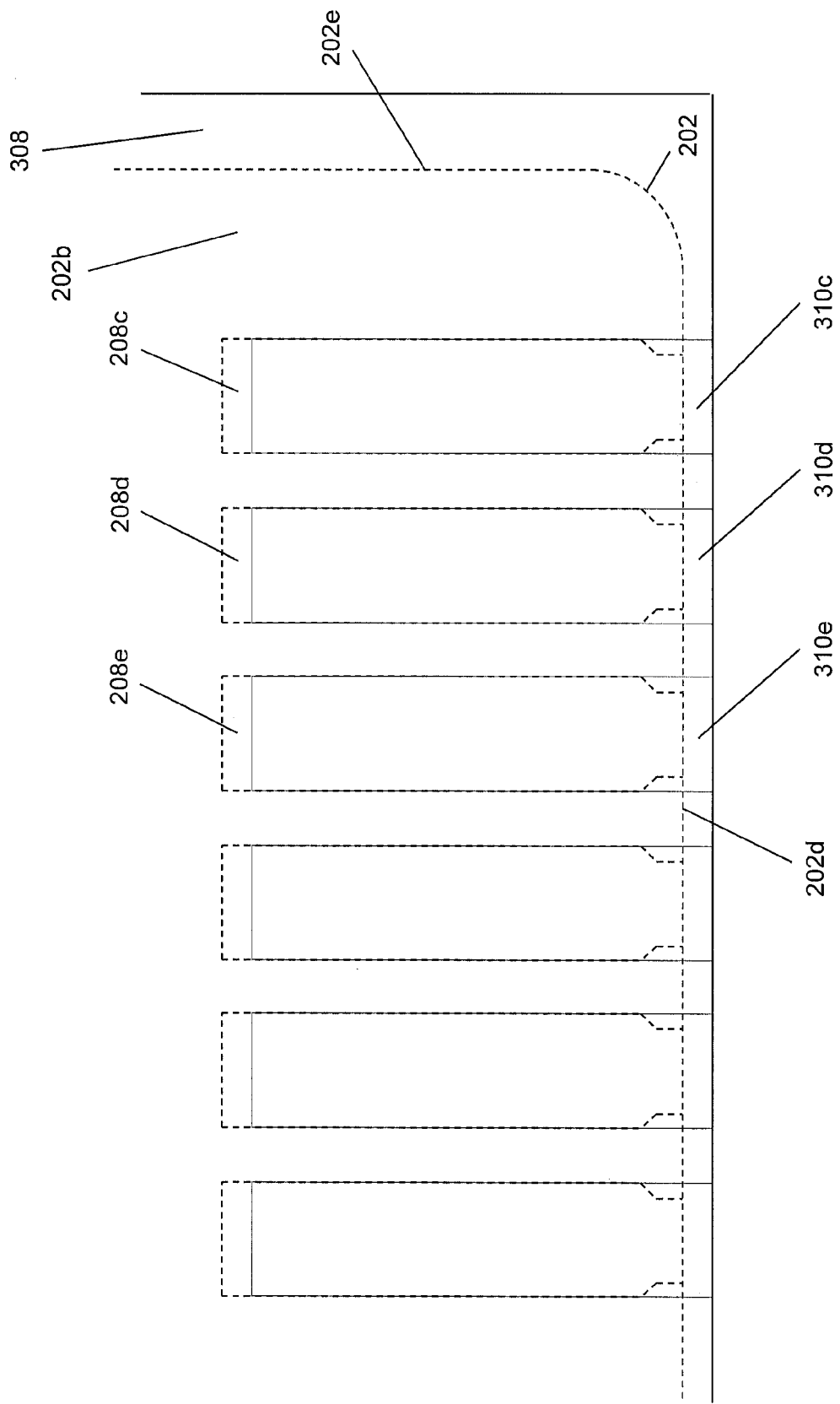
FIG. 7e is a rear view illustrating an embodiment of the memory device of FIGS. 2a and 2b properly seated in the memory device connector of FIGS. 3a and 3b.

The method 600 then proceeds to decision block 608 where it is determined whether a short is detected. Referring first to FIGS. 7d and 7e, an embodiment is illustrated where the memory device 200 is properly seated in the memory device connector 300 such that a short will not be detected at decision block 608. With the memory device 200 properly seated in the memory device connector 300, each of the memory device connections 208 on the memory device 200 is aligned with and engaging a respective memory connector pin 310 on the memory device connector 300. For example, FIG. 7d illustrates the memory device 12V connection 208a and the memory device ground connection 208b on the front surface 202a of the DDR4 DIMM memory device 200 aligned with an engaging the memory connector 12V pin 310a and the memory connector ground pin 310b, respectively, adjacent the first side of the memory device channel 308 in the DDR4 DIMM memory device connector 300. Similarly, FIG. 7e illustrates the memory device 12V connection 208c, the memory device VREF connection 208d, and the memory device ground connection 208e on the rear surface 202b of the DDR4 DIMM memory device 200 aligned with and engaging the memory connector 12V pin 310c, the memory connector VREF pin 310d, and the memory connector ground pin 310e, respectively, adjacent the second side of the memory device channel 308 in the DDR4 DIMM memory device connector 300.

Figure 7F:
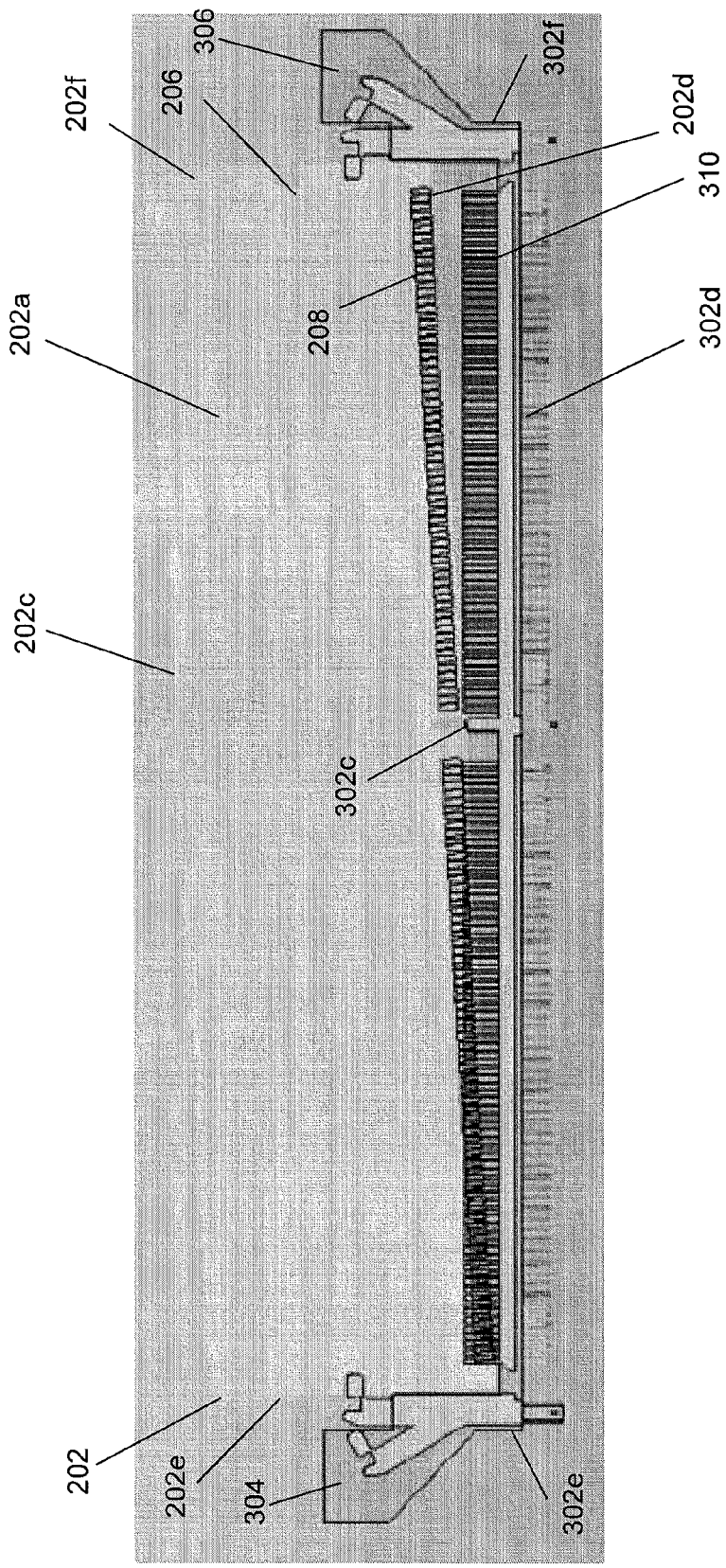
FIG. 7f is a front view illustrating an embodiment of the memory device of FIGS. 2a and 2b improperly seated in the memory device connector of FIGS. 3a and 3b.
Figure 7G:
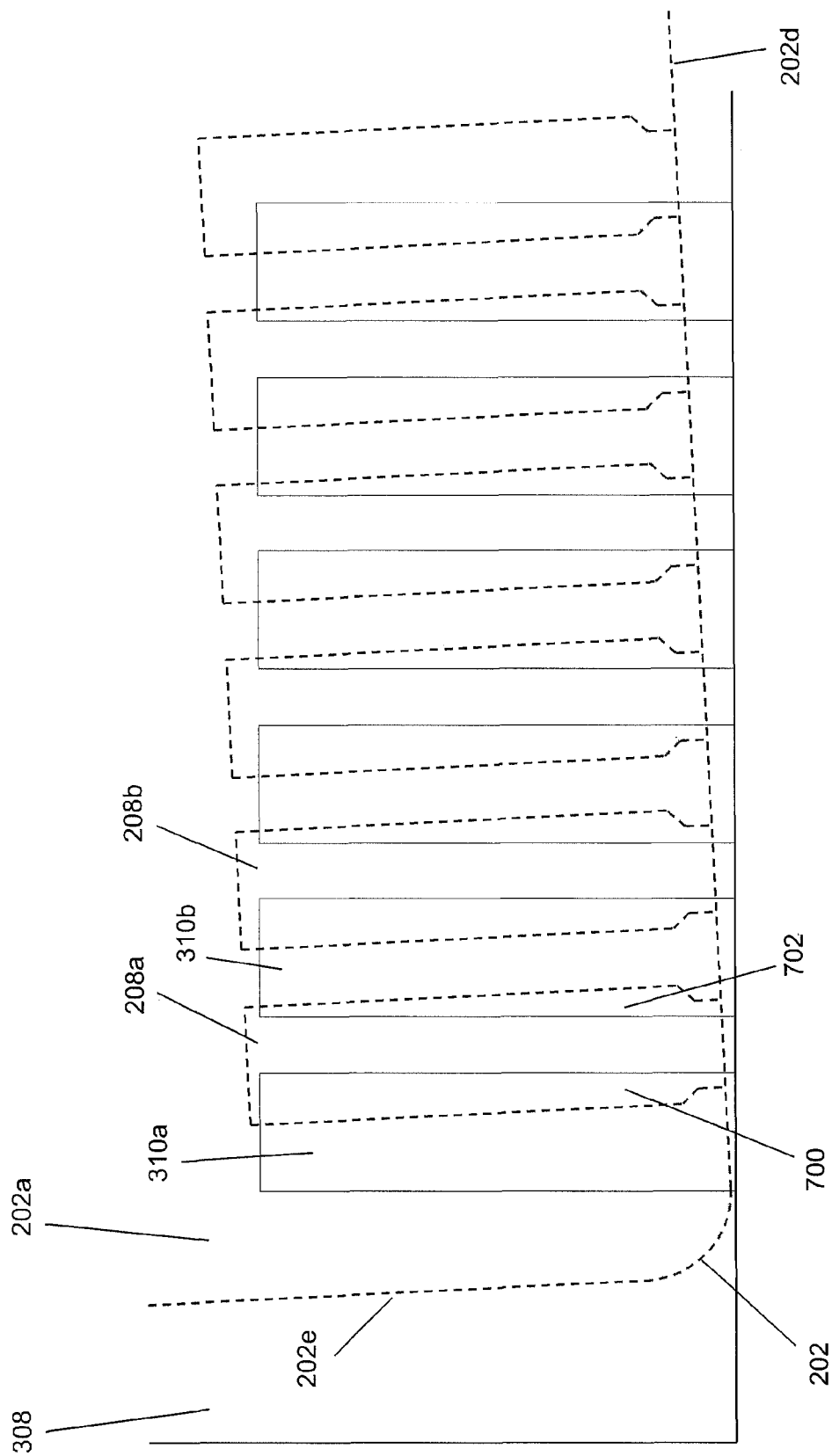
FIG. 7g is a front view illustrating an embodiment of the memory device of FIGS. 2a and 2b improperly seated in the memory device connector of FIGS. 3a and 3b.
Figure 7H:
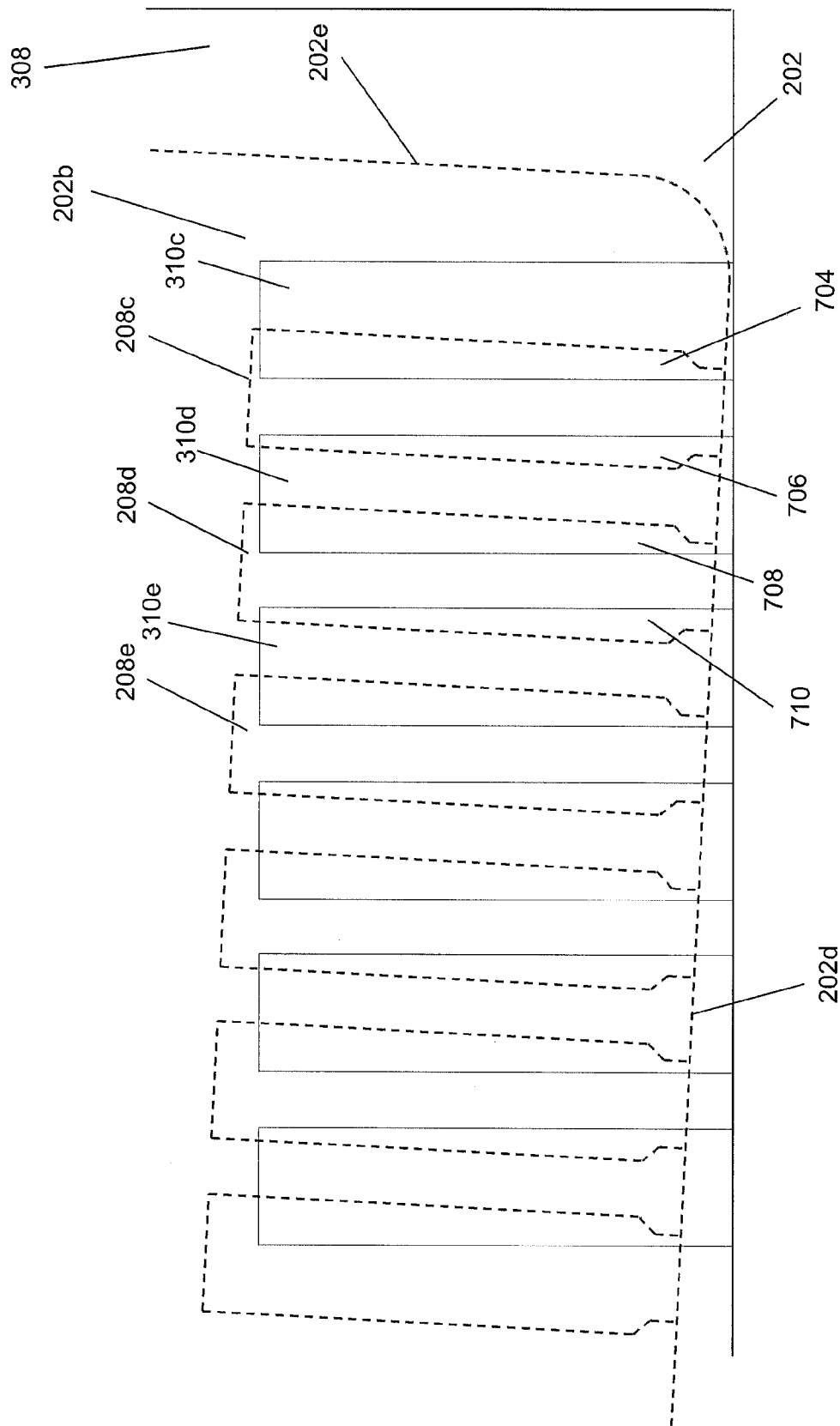
FIG. 7h is a rear view illustrating an embodiment of the memory device of FIGS. 2a and 2b improperly seated in the memory device connector of FIGS. 3a and 3b.

Referring now to FIGS. 7f, 7g, and 7h, an embodiment is illustrated where the memory device 200 is improperly seated in the memory device connector 300 such that a short will be detected at decision block 608. As discussed above, the memory device may become improperly seated, for example, due to the memory system being built or assembled improperly, as a result the memory device dislodging from the memory device connector during shipping, when the memory device is added or replaced in the memory system by a user, and/or in a variety of other scenarios known in the art. In the illustrated embodiment, the bottom edge 202d of the memory device 200 is not entirely positioned in the memory device channel 308 defined by the memory device connector 300, with a portion of the bottom edge 202d that is located adjacent the side edge 202e of the memory device 200 positioned in the memory device channel 308, but a portion of the bottom edge 202d that is located adjacent the side edge 202f extending out of the memory device channel 308, as illustrated in FIG. 7f.

With the memory device 200 improperly seated in the memory device connector 300 as illustrated in FIG. 7f, the memory device connections 208 on the memory device 200 may create a short across adjacent memory connector pins 310 on the memory device connector 300. For example, FIG. 7g illustrates how, with the memory device 200 improperly seated in the memory device connector 300, the memory device 12V connection 208a on the front surface 202a of the DDR4 DIMM memory device 200 engages both the memory connector 12V pin 310a (e.g., at engagement 700) and the memory connector ground pin 310b (e.g., at engagement 702), adjacent the first side of the memory device channel 308 in the DDR4 DIMM memory device connector 300, creating a short across the memory connector 12V pin 310a and the memory connector ground pin 310b. FIG. 7h illustrates how, with the memory device 200 improperly seated in the memory device connector 300, the memory device 12V connection 208c on the rear surface 202b of the DDR4 DIMM memory device 200 engages both the memory connector 12V pin 310c (e.g., at engagement 704) and the memory connector VREF pin 310d (e.g., at engagement 706) adjacent the second side of the memory device channel 308 in the DDR4 DIMM memory device connector 300, creating a short across the memory connector 12V pin 310c and the memory connector VREF pin 310d. FIG. 7h also illustrates how, with the memory device 200 improperly seated in the memory device connector 300, the memory device VREF connection 208d on the rear surface 202b of the DDR4 DIMM memory device 200 engages both the memory connector VREF pin 310d (e.g., at engagement 708) and the memory connector ground pin 310e (e.g., at engagement 710) adjacent the second side of the memory device channel 308 in the DDR4 DIMM memory device connector 300, creating a short across the memory connector VREF pin 310d and the memory connector ground pin 310e. While an example has been provided where multiple shorts exists across multiple memory connector pins 310, one of skill in the art will recognize that any one of those shorts may exist by itself, and/or different combinations of shorts may exist as well.

Referring now to FIG. 7b, with the short detection circuit 502 enabled, the isolation devices 504 is providing the short detection voltage at node 508 and the isolation devices 524 is providing the short detection voltage at node 528. As discussed in further detail below, the operation of the short detection circuit 502 to detect whether a short exists in the memory system can be described by charts A and B below, using values that result from the components detailed in FIG. 7b:

CHART A

|  | NODE 508 | NODE 528 |
|---|---|---|
| NO SHORT | 52.6 mV | 113.7 mV |
| VREF/GROUND SHORT | 0 | 113.7 mV |
| VREF/12 V/GROUND SHORT | 0 | 0 |
| 12 V/GROUND SHORT | 52.6 mV | 0 |
| VREF/12 V SHORT | ≤71.94 mV | ≥71.94 mV |

CHART B

|  | COMPARATOR 514 | COMPARATOR 534 | DEVICE 518 |
|---|---|---|---|
| NO SHORT | 1 | 1 | 1 |
| 12 V/GROUND SHORT | X | 0 | 0 |
| VREF/12 V/GROUND SHORT | 0 | 0 | 0 |
| VREF/12 V SHORT | X | 0 | 0 |
| VREF/GROUND SHORT | 0 | X | 0 |

With the memory device 200 properly seated in the memory device connector 300 as illustrated and described above with reference to FIGS. 7d and 7e, node 508 will provide 52.6 mV as an input to the comparator 514, and node 528 will provide 113.7 mV as an input to the comparator 534, as detailed in chart A above. As detailed in chart B above, a 52.6 mV input to the comparator 514 will produce a high (1) result (i.e., because the 52.6 mV is greater than the short detection voltage 516 of 25 mV) and the 113.7 mV input to the comparator 534 will produce a high (1) result (i.e., because the 113.7 mV is greater than the short detection voltage 536 of 95 mV), which will result in a high (1) result at the short reporting device 518.

However, with the memory device 200 improperly seated in the memory device connector 300 as described above with reference to FIGS. 7e, 7f, and 7g, the short detection circuit 502 will operate differently depending on what type of short exist. For example, assuming only the VREF power rail 412b is shorted to ground (e.g., by the memory device VREF connection 208d engaging both the memory connector VREF pin 310d and the memory connector ground pin 310e, illustrated in FIG. 7h), node 508 will provide 0 mV as an input to the comparator 514, and node 528 will provide 113.7 mV as an input to the comparator 534 (again, assuming no short exists from the 12V power rail 412a to ground), as detailed in chart A above. As detailed in chart B above, a 0 mV input to the comparator 514 will produce a low (0) result (i.e., because the 0 mV is less than the short detection voltage 516 of 25 mV), which will result in a low (0) result at the short reporting device 518 regardless of the input provided by node 528.

In another example, with both the VREF power rail 412b and the 12V power rail 412a shorted to ground (e.g., by the memory device VREF connection 208d engaging both the memory connector VREF pin 310d and the memory connector ground pin 310e, as illustrated in FIG. 7h, and by the memory device 12V connection 208a engaging both the memory connector 12V pin 310a and the memory connector ground pin 310b, as illustrated in FIG. 7g), node 508 will provide 0 mV as an input to the comparator 514, and node 528 will provide 0 mV as an input to the comparator 534, as detailed in chart A above. As detailed in chart B above, a 0 mV input to the comparator 514 will produce a low (0) result (i.e., because the 0 mV is less than the short detection voltage 516 of 25 mV), which will result in a low (0) result at the short reporting device 518 regardless of the input provided by node 528. Similarly, a 0 mV input to the comparator 534 will produce a low (0) result (i.e., because the 0 mV is less than the short detection voltage 536 of 95 mV), which will result in a low (0) result at the short reporting device 518 regardless of the input provided by node 508.

In another example, assuming only the 12V power rail 412a is shorted to ground (e.g., by memory device 12V connection 208a engaging both the memory connector 12V pin 310a and the memory connector ground pin 310b, as illustrated in FIG. 7g), node 528 will provide 0 mV as an input to the comparator 534, and node 508 will provide 52.6 mV as an input to the comparator 514 (again, assuming no short exists from the VREF power rail 412b to ground), as detailed in chart A above. As detailed in chart B above, a 0 mV input to the comparator 534 will produce a low (0) result (i.e., because the 0 mV is less than the short detection voltage 536 of 95 mV), which will result in a low (0) result at the short reporting device 518 regardless of the input provided by node 508.

In another example, assuming only the 12V power rail 412a is shorted to the VREF power rail 412b (e.g., by memory device 12V connection 208c engaging both the memory connector 12V pin 310c and the memory connector VREF pin 310d, as illustrated in FIG. 7h), node 508 will provide less than or equal to 71.94 mV as an input to the comparator 514, and node 528 will provide greater than or equal to 71.94 mV as an input to the comparator 534, as detailed in chart A above. As detailed in chart B above, a less than or equal to 71.94 mV input to the comparator 534 will produce a low (0) result (i.e., because the less than or equal to 71.94 mV is less than the short detection voltage 536 of 95 mV), which will result in a low (0) result at the short reporting device 518 regardless of the input provided by node 508.

While a number of specific examples of the detection of shorts at decision block 608 using the short detection circuit 502 illustrated in FIG. 7b have been described, one of skill in the art in possession of the present disclosure will recognize that a wide variety of circuits, circuit components, and circuit configurations may provide for the functionality discussed above and will fall within the scope of the present disclosure.

If, at decision block 608 it is determined that a short exists, the method 600 proceeds to block 610 where power is prevented to the memory device connector and a notification is sent. In an embodiment, the short protection engine is coupled to the short reporting device 518, and is configured to interpret a low signal from the short reporting device 518 as an indication that a short is present at decision block 608, and a high signal from the short reporting device 518 as an indication that no short is present at decision block 608. At block 610, in response to a low signal from the short reporting device 518, the short protection engine in the short protection system 412 prevents power from being provided from the power supply system 404 through the first power rail 408 and the second power rail 410 to the memory device connector 300/406. For example, the short protection engine may include a complex programmable logic device (CPLD) that is coupled to the short reporting device 518 and that controls power sequencing of the power supply system 404 to prevent the first power rail 408 and the second power rail 410 from powering up. In another example, the short reporting device 518 may be directly coupled to a PSU_ENABLE input in the power supply system 404, and the output of the comparators 514 and 534 provide a digital signal to indicate the short status of the memory system directly to the power supply system 406. In an embodiment, the short protection engine in the short protection system 412 is configured to send a notification to a user that a short has been detected in the memory system (e.g., via a message on a display, operation of an LED, etc.) The method 600 then returns to decision block 608 to detect whether a short exists. As such, the method 600 operates to continually prevent power to the memory device connector 300/406 as long as a short is detected in the memory system.

If, at decision block 608, a short is not detected, the method 600 proceeds to block 612 where the short detection circuit is disabled. In an embodiment of block 612, the short protection engine in the short protection system 412 operates to disable the isolation devices 504 and 524 such that no power is provided to the short detection circuit 502. It should be understood that blocks 606 and 612 of the method 600 may be omitted when short detection circuits are included in the short protection system that are always enabled. The method 600 then proceeds to block 614 where power is allowed to the memory device connector. In an embodiment of block 614, the short protection engine in the short protection system 412 is configured (e.g., via the connection 412c) to allow the power supply system 404 to power up the first power rail 408 and the second power rail 410 such that power is provided to the memory device connector 406.

Thus, systems and methods for detecting a short in a memory system have been described that prevent power from being supplied to a memory device connector when a memory device has been improperly seated in the memory device connector such that a short exists across pins in the memory device connector. In some embodiments, the systems and methods provide for the detection of multiple possible short scenarios, and ensure that power is not provided to the memory device connector in any of those scenarios. While one memory device connector has been described above, one of skill in the art in possession of the present disclosure will recognize that shorts existing in any number of memory device connectors may detected and protected against using the teachings of the present disclosure, and thus will fall within its scope.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A short protection system, comprising:
a device connector that includes a first pin and a second pin that is located adjacent the first pin, wherein the first pin is coupled to a first power rail that is configured to provide a first current when no short exists across the first pin and the second pin; and
a short detection circuit coupled to the first pin, wherein the short detection circuit is configured to:
cause, prior to the first current being provided from the first power rail, a second current to be provided from the first power rail that is less than the first current and that is configured such that a device coupled to the first pin and the second pin will not be damaged when a short exists across the first pin and the second pin;
compare the second current to a first short detection current;
determine whether a short exists across the first pin and the second pin based on the comparing of the second current to the first short detection current; and
prevent the first current from being provided from the first power rail to the device connector in response to determining a short exists across the first pin and the second pin.

2. The short protection system of claim 1, wherein the second pin is coupled either to a second power rail or to ground.

3. The short protection system of claim 1, wherein the short detection circuit includes a first resistor network that is coupled to the first pin and that is configured to provide the second current.

4. The short protection system of claim 1, wherein the short detection circuit includes an isolation device that is coupled to the first pin and that is configured to provide the second current.

5. The short protection system of claim 1, further comprising:
a third pin that is located adjacent the first pin on the device connector;
a second power rail coupled to the second pin and configured to provide a third current when no short exists across the first pin and either or both of the second pin and the third pin, wherein the short detection circuit is coupled to the second pin and configured to:
provide a fourth current from the second power rail that is less than the third current and that is configured such that a device coupled to the first pin and either or both of the second pin and the third pin will not be damaged when a short exists across the first pin and either or both of the second pin and the third pin;
compare the fourth current to a second short detection current;
determine whether a short exists across the first pin and either or both of the second pin and the third pin based on the comparing of the second current to the first short detection current and the fourth current to the second short detection current; and
prevent power from being provided to the device connector in response to either determining a short exists across the first pin and either or both of the second pin and the third pin.

6. The short protection system of claim 5, wherein the first power rail is a 12V power rail, the second power rail is a VREF power rail, and the third pin is coupled to ground.

7. The short protection system of claim 5, wherein the short detection circuit includes a second resistor network that is coupled to the second pin and that is configured to provide the fourth current.

8. An information handling system (IHS), comprising:
a power supply system including a first power rail that is configured to provide a first current when no short is associated with the power supply system;
a processing system coupled to the power supply system;
a memory system that is coupled to the processing system and that includes a memory device connector that is configured to couple to a memory device, wherein the memory device connector includes a first pin that is coupled to the first power rail, and a second pin that is located adjacent the first pin;
a short detection circuit coupled to the first pin, wherein the short detection circuit is configured to:
cause, prior to the first current being provided from the first power rail, a second current to be provided from the first power rail that is less than the first current and that is configured such that a memory device coupled to the memory device connector will not be damaged when a short exists across the first pin and the second pin;
compare the second current to a first short detection current;

determine whether a short exists across the first pin and the second pin based on the comparing of the second current to the first short detection current; and prevent the first current from being provided from the first power rail to the memory device connector in response to determining a short exists across the first pin and the second pin.

9. The IHS of claim 8, wherein the second pin is coupled either to a second power rail in the power supply system or to ground.

10. The IHS of claim 8, wherein the short detection circuit includes a first resistor network that is coupled to the first pin and that is configured to provide the second current.

11. The IHS of claim 8, wherein the short detection circuit includes a first isolation device that is coupled to the first pin and that is configured to provide the second current.

12. The IHS of claim 8, further comprising:
a third pin on the memory device connector that is located adjacent the first pin;
a second power rail in the power supply system that is coupled to the second pin and configured to provide a third current when no short is associated with the power supply system, wherein the short detection circuit is coupled to the second pin and configured to:
provide a fourth current from the second power rail that is less than the third current and that is configured such that a memory device coupled to the memory device connector will not be damaged when a short exists across the first pin and either or both of the second pin and the third pin;
compare the fourth current to a second short detection current;
determine whether a short exists across the first pin and either or both of the second pin and the third pin based on the comparing of the second current to the first short detection current and the fourth current to the second short detection current; and
prevent power from being provided to the memory device connector in response to determining a short exists across the first pin and either or both of the second pin and the third pin.

13. The IHS of claim 12, wherein the first power rail is a 12V power rail, the second power rail is a VREF power rail, and the third pin is coupled to ground.

14. The IHS of claim 8, wherein the memory device connector is a double data rate fourth generation (DDR4) memory device connector that is configured to couple to a double data rate fourth generation (DDR4) memory device.

15. A method for detecting a short in a memory system, comprising:
receiving a memory device in a memory device connector that includes a first pin that is coupled to a first power rail and a short detection circuit, and a second pin located adjacent the first pin, wherein the first power rail is configured to provide a first current when no short exists across the first pin and the second pin;

causing, using the short detection circuit and prior to the first current being provided from the first power rail, a second current to be provided from the first power rail that is less than the first current and that is configured such that the memory device coupled to the first pin and the second pin will not be damaged when a short exists across the first pin and the second pin;
comparing, using the short detection circuit, the second current to a first short detection current;
determining, using the short detection circuit, whether a short exists across the first pin and the second pin based on the comparing of the second current to the first short detection current; and
preventing, using the short detection circuit, the first current from being provided from the first power rail to the memory device connector in response to determining a short exists across the first pin and the second pin.

16. The method of claim 15, wherein the second pin is coupled either to a second power rail or to ground.

17. The method of claim 15, wherein the short detection circuit includes a first resistor network that is coupled to the first pin and that is configured to provide the second current.

18. The method of claim 15, wherein the memory device connector includes a third pin that is located adjacent the first pin, the second pin is coupled to the short detection circuit and a second power rail that is configured to provide a third current when no short exists across the first pin and either or both of the second pin and the third pin, and wherein the method further comprises:
providing, using the short detection circuit, a fourth current from the second power rail that is less than the third current and that is configured such that the memory device coupled to the first pin and either or both of the second pin and the third pin will not be damaged when a short exists across the first pin and either or both of the second pin and the third pin;
comparing, using the short detection circuit, the fourth current to a second short detection current;
determining, using the short detection circuit, whether a short exists across the first pin and either or both of the second pin and the third pin based on the comparing of the second current to the first short detection current and the fourth current to the second short detection current; and
preventing, using the short detection circuit, power from being provided to the memory device connector in response to determining a short exists across the first pin and either or both of the second pin and the third pin.

19. The method of claim 18, wherein the first power rail is a 12V power rail, the second power rail is a VREF power rail, and the third pin is coupled to ground.

20. The method of claim 15, wherein the memory device connector is a double data rate fourth generation (DDR4) memory device connector that is configured to couple to a DDR4memory device.

* * * * *